United States Patent
He et al.

(10) Patent No.: US 12,232,338 B2
(45) Date of Patent: Feb. 18, 2025

(54) LOW-VOLTAGE OPERATION DUAL-GATE ORGANIC THIN-FILM TRANSISTORS AND METHODS OF MANUFACTURING THEREOF

(71) Applicants: Corning Incorporated, Corning, NY (US); UNIVERSITY-INDUSTRY COOPERATION GROUP OF KYUNG HEE UNIVERSITY, Seoul (KR)

(72) Inventors: Mingqian He, Horseheads, NY (US); Jin Jang, Seoul (KR); Xiuling Li, Tianshui (CN); Robert George Manley, Vestal, NY (US); Karan Mehrotra, Painted Post, NY (US); Nikolay Zhelev Zhelev, Painted Post, NY (US)

(73) Assignees: CORNING INCORPORATED, Corning, NY (US); UNIVERSITY-INDUSTRY COOPERATION GROUP OF KYUNG HEE UNIVERSITY, Seoul (KR)

( * ) Notice: Subject to any disclaimer, the term of this patent is extended or adjusted under 35 U.S.C. 154(b) by 502 days.

(21) Appl. No.: 17/608,291

(22) PCT Filed: May 7, 2020

(86) PCT No.: PCT/US2020/031741
§ 371 (c)(1),
(2) Date: Nov. 2, 2021

(87) PCT Pub. No.: WO2020/231710
PCT Pub. Date: Nov. 19, 2020

(65) Prior Publication Data
US 2022/0209149 A1 Jun. 30, 2022

Related U.S. Application Data

(60) Provisional application No. 62/846,070, filed on May 10, 2019.

(51) Int. Cl.
H01L 29/08 (2006.01)
H10K 10/46 (2023.01)
(Continued)

(52) U.S. Cl.
CPC ......... H10K 10/482 (2023.02); H10K 85/113 (2023.02); H10K 85/151 (2023.02); *H10K 71/00* (2023.02)

(58) Field of Classification Search
CPC .. H10K 10/482; H10K 85/113; H10K 85/151; H10K 71/00
(Continued)

(56) References Cited

U.S. PATENT DOCUMENTS

| 6,344,662 B1 | 2/2002 | Dimitrakopoulos et al. |
| 10,026,911 B2 | 7/2018 | Enicks et al. |

(Continued)

FOREIGN PATENT DOCUMENTS

| CN | 103594626 A | * | 2/2014 | ......... H01L 51/0001 |
| GB | 2534600 A | | 8/2016 | |

(Continued)

OTHER PUBLICATIONS

B. K. Sharma, et al., "Flexible and stretchable oxide electronics", Advance Electronic Material, vol. 2, No. 8, Jun. 2016.
(Continued)

*Primary Examiner* — Phuc T Dang
(74) *Attorney, Agent, or Firm* — Travis B. Gasa

(57) ABSTRACT

A thin-film transistor (TFT), includes: a substrate (202); an organic semiconductor (OSC) layer (210) positioned on the substrate; a dielectric layer (214) positioned on the OSC
(Continued)

layer; and a polymeric interlayer (212) disposed in-between the OSC layer and the dielectric layer, such that the dielectric layer is configured to exhibit a double layer capacitance effect. A method of forming a thin-film transistor, includes: providing a substrate; providing a bottom gate layer atop the substrate; disposing consecutively from the substrate, an organic semiconductor (OSC) layer, a dielectric layer, and a top gate layer; and patterning the OSC layer, the dielectric layer, and the top gate layer using a single mask.

19 Claims, 11 Drawing Sheets

(51) Int. Cl.
  *H10K 85/10* (2023.01)
  *H10K 71/00* (2023.01)
(58) Field of Classification Search
  USPC .......................................................... 257/40
  See application file for complete search history.

(56) References Cited

U.S. PATENT DOCUMENTS

| | | | |
|---|---|---|---|
| 2013/0285061 A1* | 10/2013 | Shukla | H10K 10/471 |
| | | | 438/479 |
| 2017/0104080 A1 | 4/2017 | Lu et al. | |
| 2017/0331057 A1 | 11/2017 | Chung et al. | |
| 2019/0250509 A1* | 8/2019 | Okachi | G03F 7/008 |

FOREIGN PATENT DOCUMENTS

| | | |
|---|---|---|
| JP | 2005-005582 A | 1/2005 |
| WO | 2015/177541 A1 | 11/2015 |

OTHER PUBLICATIONS

D. M. Taylor, et al., "Fabrication and simulation of organic transistors and functional circuits", Chemical Physics, vol. 456, No. 29, Jul. 2015, pp. 85-92.

Ging-Ji Nathan Wang et al: "Inducing Elasticity through Oligo-Siloxane Crosslinks for Intrinsically Stretchable Semiconducting Polymers", Advanced Functional Materials, vol. 26, No. 40, Oct. 2016, pp. 7254-7262.

Hyunjin Park, et al., "Parylene-Based Double-Layer Gate Dielectrics for Organic Field-Effect Transistors", American Chemical Society, vol. 10,44, Oct. 2018, pp. 37767-37772.

International Search Report and Written Opinion of the International Searching Authority; PCT/US2020/031741; dated Sep. 22, 2020; 18 pages; European Patent Office.

J. Y. Oh, et al., "Intrinsically stretchable and healable semiconducting polymer for organic transistors", Nature, vol. 539, Nov. 2016, pp. 411-415.

Joseph W. Rumer et al: "Organic photovoltaics: Crosslinking for optimal morphology and stability", Materials Today, vol. 18, No. 8, Oct. 2015, pp. 425-435.

K. Cherenack, et al., "Woven Electronic Fibers with Sensing and Display Functions for Smart Textiles", Advance Material, vol. 22, Oct. 2010, pp. 5178-5182.

K.-S. Son, et al., "Characteristics of double-gate Ga—In—Zn—O thin-film transistor", Electron Device Letters 31, No. 3, Mar. 2010, pp. 219-221.

Liu, Kuan-Hsien, et al., "Towards commercial organic electronics and comprehensive comparison of device performance and reliability of organic and a-Si:H thin-film transistor technologies", SID Symposium Digest of Technical Papers, vol. 48, No. 1, May 2017, pp. 173-175.

M. J. Harding, et al., "Flexible LCDs Enabled by Otft", SID Symposium Digest of Technical Papers, vol. 48, No. 1, May 2017, pp. 793-796.

S. Bain, et al., "Photolithographic integration of high performance polymer thin-film transistors", SID Symposium Digest of Technical Papers, vol. 41, No. 1, May 2016, pp. 865-868.

S. Steudel, K. Myny, et al., "Design and realization of a flexible QQVGA AMOLED display with organic TFTs", Organic Electronics, vol. 13, No. 9, Sep. 2012, pp. 1729-1735.

T. Sekitani, et al., "Stretchable organic integrated circuits for large-area electronic skin surfaces", MRS Bulletin, vol. 37, Mar. 2012, pp. 236-245.

T.-K. Chuang, et al., "Top-emitting 230 dots/in. active-matrix polymer light-emitting diode displays on flexible metal foil substrates", Applied Physics Letters, vol. 90, Apr. 2007, pp. 4.

X. Li, et al., "High-speed dual-gate a-IGZO TFT-based circuits with top-gate offset structure", IEEE Electron Device Letters, vol. 35, No. 4, Apr. 2014, pp. 461-463.

X.Guo, et al., "Current status and opportunities of organic thin-film transistor technologies", IEEE Transactions Electron Devices, vol. 64, No. 5, May 2017, pp. 1906-1921.

Y. Ito, et al., "Crystalline ultrasmooth self-assembled monolayers of alkylsilanes for organic field-effect transistors", J. Am. Chem. Soc., vol. 131, No. 26, Jun. 2009, pp. 9396-9404.

* cited by examiner

LOW-VOLTAGE OPERATION DUAL-GATE ORGANIC THIN-FILM TRANSISTORS AND METHODS OF MANUFACTURING THEREOF

This application claims the benefit of priority under 35 U.S.C. § 371 of International Application No. PCT/US2020/031741, filed on May 7, 2020, which claims the benefit of priority under 35 U.S.C. § 119 of U.S. Provisional Application Ser. No. 62/846,070, filed on May 10, 2019, the content of each of which are relied upon and incorporated herein by reference in their entirety.

BACKGROUND

1. Field

CROSS-REFERENCE TO RELATED APPLICATIONS

The disclosure relates to low-voltage operation dual-gate (DG) organic thin-film transistors (OTFTs).

2. Technical Background

Organic thin-film transistors (OTFTs) have unique advantages such as flexibility, solution process, and low thermal budget, as compared with inorganic silicon-based counterparts (i.e. a-Si:H TFTs, LTPS TFTs) and amorphous oxide semiconductor (AOS)-based TFTs. For example, conventional silicon-based technologies often require high temperature and high vacuum deposition processes, as well as complex photolithographic patterning methods.

Currently available OTFT-based devices lack high resolution OTFT backplanes which are compatible with current photolithographic display manufacturing processes and further improvements are needed for device driving capability, stability, and yields over large display areas. Additionally, reducing operation voltage by use of high-k gate dielectrics and novel device structures are needed to minimize power consumption and extend device lifetime.

This disclosure presents improved low-voltage operation, dual-gate (DG) OTFTs formed by a novel masking process for display applications.

SUMMARY

In some embodiments, a thin-film transistor (TFT), comprises: a substrate; an organic semiconductor (OSC) layer positioned on the substrate; a dielectric layer positioned on the OSC layer; and a polymeric interlayer disposed in-between the OSC layer and the dielectric layer, wherein the dielectric layer is configured to exhibit a double layer capacitance effect.

In one aspect, which is combinable with any of the other aspects or embodiments, the OSC layer is a polymer blend, comprises: at least one organic semiconductor (OSC) polymer, wherein the at least one OSC polymer is a diketopyrrolopyrrole-fused thiophene polymeric material, wherein the fused thiophene is beta-substituted.

In one aspect, which is combinable with any of the other aspects or embodiments, the at least one OSC polymer comprises a first portion and a second portion, wherein at least one of the first portion or the second portion comprises at least one UV-curable side chain.

In one aspect, which is combinable with any of the other aspects or embodiments, the at least one UV-curable side chain comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, only the first portion comprises at least one UV-curable side chain.

In one aspect, which is combinable with any of the other aspects or embodiments, both the first portion and the second portion comprise the at least one UV-curable side chain.

In one aspect, which is combinable with any of the other aspects or embodiments, the polymer blend further comprises: at least one crosslinker, wherein the at least one crosslinker comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, the polymer blend further comprises: at least one photoinitiator, wherein the at least one photoinitiator is present in a range of 0.1 wt. % to 10 wt. %.

In one aspect, which is combinable with any of the other aspects or embodiments, the polymer blend further comprises: at least one of antioxidants, lubricants, compatibilizers, leveling agents, or nucleating agents present in a range of 0.05 wt. % to 5 wt. %.

In one aspect, which is combinable with any of the other aspects or embodiments, the at least one OSC polymer comprises the repeat unit of Formula 1 or Formula 2, or a salt, isomer, or analog thereof:

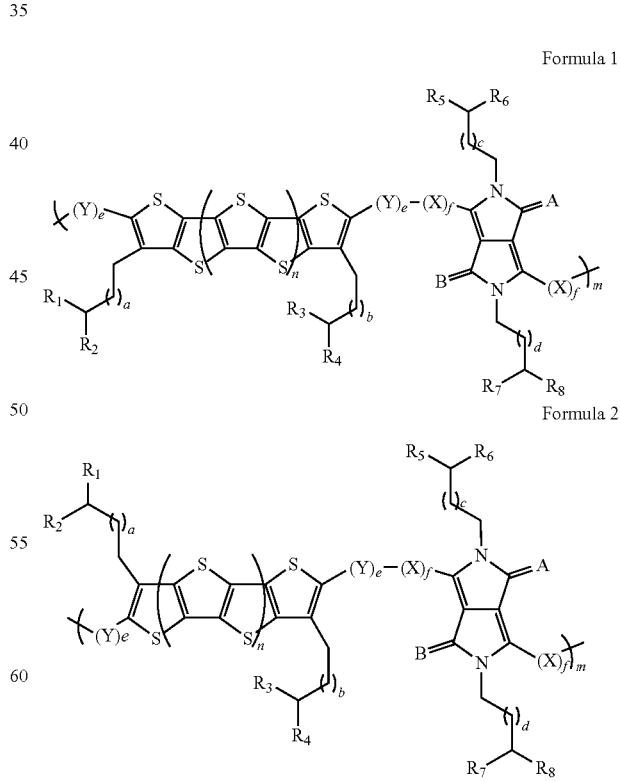

Formula 1

Formula 2 wherein in Formula 1 and Formula 2: m is an integer greater than or equal to one; n is 0, 1, or 2; $R_1$, $R_2$, $R_3$, $R_4$, $R_5$, $R_6$, R₇, and R₈, may be, independently, hydrogen, substituted or unsubstituted $C_4$ or greater alkyl, substituted or unsubstituted $C_4$ or greater alkenyl, substituted or unsubstituted $C_4$ or greater alkynyl, or Cs or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (vi) the polymer having a molecular weight, wherein the molecular weight of the polymer is greater than 10,000.

In one aspect, which is combinable with any of the other aspects or embodiments, for the first portion, $R_5$ and $R_7$ are hydrogen and $R_6$ and $R_8$ are substituted or unsubstituted $C_4$ or greater alkenyl.

In one aspect, which is combinable with any of the other aspects or embodiments, for the first portion and the second portion, $R_5$ and $R_7$ are hydrogen and $R_6$ and $R_8$ are substituted or unsubstituted $C_4$ or greater alkenyl.

In one aspect, which is combinable with any of the other aspects or embodiments, at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, the polymer blend further comprises: at least one photoinitiator, wherein the at least one photoinitiator comprises: 1-hydroxy-cyclohexyl-phenyl-ketone (184); 2-benzyl-2-dimethylamino-1-(4-morpholinophenyl)-butanone-1 (369); diphenyl(2,4,6-trimethylbenzoyl)phosphine oxide (TPO); 2-isopropyl thioxanthone (ITX); 1-[4-(phenylthio) phenyl]-1,2-octanedione 2-(O-benzoyloxime) (HRCURE-OXE01); 2,2-dimethoxy-1,2-diphenylethan-1-one (BDK); benzoyl peroxide (BPO); hydroxyacetophenone (HAP); 2-hydroxy-2-methylprophenone (1173); 2-methyl-4'-(methylthio)-2-morpholinopropiophenone (907); 2-benzyl-2-(dimethylamino)-4'-morpholinobutyrophenone (IHT-PI 910); Ethyl-4-(dimethylamino)benzoate (EDB); methyl o-benzoyl benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thiozanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4(methylthiol)phenyl]-2-morpholino propanone (1) (MMMP); 4-phenylbenzophenone (PBZ); 2,4,6-trimethylbenzoly-ethoxyl phenyl phosphine oxide (TEPO); bis(4-tert-butylphenyl) iodonium perfluoro-1-butanesulfonate; bis(4-tert-butylphenyl) iodonium p-toluenesulfonate; bis(4-tert-butylphenyl) iodonium triflate; boc-methoxyphenyldiphenylsulfonium triflate; (4-tert-Butylphenyl) diphenylsulfonium triflate; diphenyliodonium hexafluorophosphate; diphenyliodonium nitrate; diphenyliodonium p-toluenesulfonate; diphenyliodonium triflate; (4-fluorophenyl) diphenylsulfonium triflate; N-hydroxynaphthalimide triflate; N-hydroxy-5-norbornene-2,3-dicarboximide perfluoro-1-butanesulfonate; (4-iodophenyl) diphenylsulfonium triflate; (4-methoxyphenyl) diphenylsulfonium triflate; 2-(4-Methoxystyryl)-4,6-bis (trichloromethyl)-1,3,5-triazine; (4-methylthiophenyl) methyl phenyl sulfonium triflate; 1-naphthyl diphenylsulfonium triflate; (4-phenoxyphenyl) diphenylsulfonium triflate; (4-phenylthiophenyl) diphenylsulfonium triflate; triarylsulfonium hexafluoroantimonate salts, mixed 50 wt. % in propylene carbonate; triarylsulfonium hexafluorophosphate salts, mixed 50 wt. % in propylene carbonate; triphenylsulfonium perfluoro-1-butanesufonate; triphenylsulfonium triflate; tris (4-tert-butylphenyl) sulfonium perfluoro-1-butanesulfonate; tris(4-tert-butylphenyl)sulfonium triflate; aryl diazo salts; diaryliodonium salts; triaryl sulfonium salts; aryl ferrocenium salts; or combinations thereof.

In one aspect, which is combinable with any of the other aspects or embodiments, the interlayer comprises at least one of: polymethyl methacrylate (PMMA), parylene, polystyrene, polyimide, poly(3-dodecylthiophene-2,5-diyl) (P3DDT), polyvinyl phenol, polyvinyl alcohol, poly (4-vinyl phenol) (P4VP), polyacrylic acid, or combinations or copolymers thereof.

In one aspect, which is combinable with any of the other aspects or embodiments, the interlayer has a thickness in a range of 1 nm to 100 nm.

In one aspect, which is combinable with any of the other aspects or embodiments, the dielectric layer is a high-k dielectric layer comprising at least one of polyvinylidene fluoride-hexafluoropropylene (PVDF-HFP), alkali ion-containing polyacrylic acid, or combinations thereof.

In one aspect, which is combinable with any of the other aspects or embodiments, the dielectric layer has a thickness in a range of 1 nm to 1000 nm.

In one aspect, which is combinable with any of the other aspects or embodiments, the TFT further comprises: a bottom gate disposed on the substrate; a second dielectric disposed at least in-between the bottom gate and the OSC layer; source and drain electrodes positioned atop the second dielectric and in direct contact with the OSC layer; and a top gate in direct contact with the dielectric layer.

In one aspect, which is combinable with any of the other aspects or embodiments, the TFT further comprises: a polymeric self-assembled monolayer (SAM) disposed over the second dielectric layer and source and drain electrodes.

In one aspect, which is combinable with any of the other aspects or embodiments, the SAM comprises at least one of octadecyltrimethoxysilane (OTS), hexamethyldisilazane (HMDS), octadecylphosphonic acid (ODPA), or combinations thereof.

In one aspect, which is combinable with any of the other aspects or embodiments, the TFT is configured to achieve at least one of: a field-effect mobility ($\mu_{FE}$) of at least 0.3 cm²/V·s; a sub-threshold slope of at most 0.27 V/dec; and a turn-on voltage ($V_{ON}$) of at most 2.5V under an operation voltage of 5V.

In some embodiments, a method of forming a thin-film transistor (TFT), comprises: providing a substrate; providing a bottom gate layer atop the substrate; disposing consecutively from the substrate, an organic semiconductor (OSC) layer, a dielectric layer, and a top gate layer; and patterning the OSC layer, the dielectric layer, and the top gate layer using a single mask.

In one aspect, which is combinable with any of the other aspects or embodiments, the method further comprises: providing a polymeric interlayer in-between the OSC layer and the dielectric layer, wherein the step of patterning comprises: patterning the OSC layer, the polymeric interlayer, the dielectric layer, and the top gate layer.

In one aspect, which is combinable with any of the other aspects or embodiments, the method comprises at most four patterning steps.

BRIEF DESCRIPTION OF THE DRAWINGS

The disclosure will become more fully understood from the following detailed description, taken in conjunction with the accompanying figures, in which.

DETAILED DESCRIPTION

Figure 1:
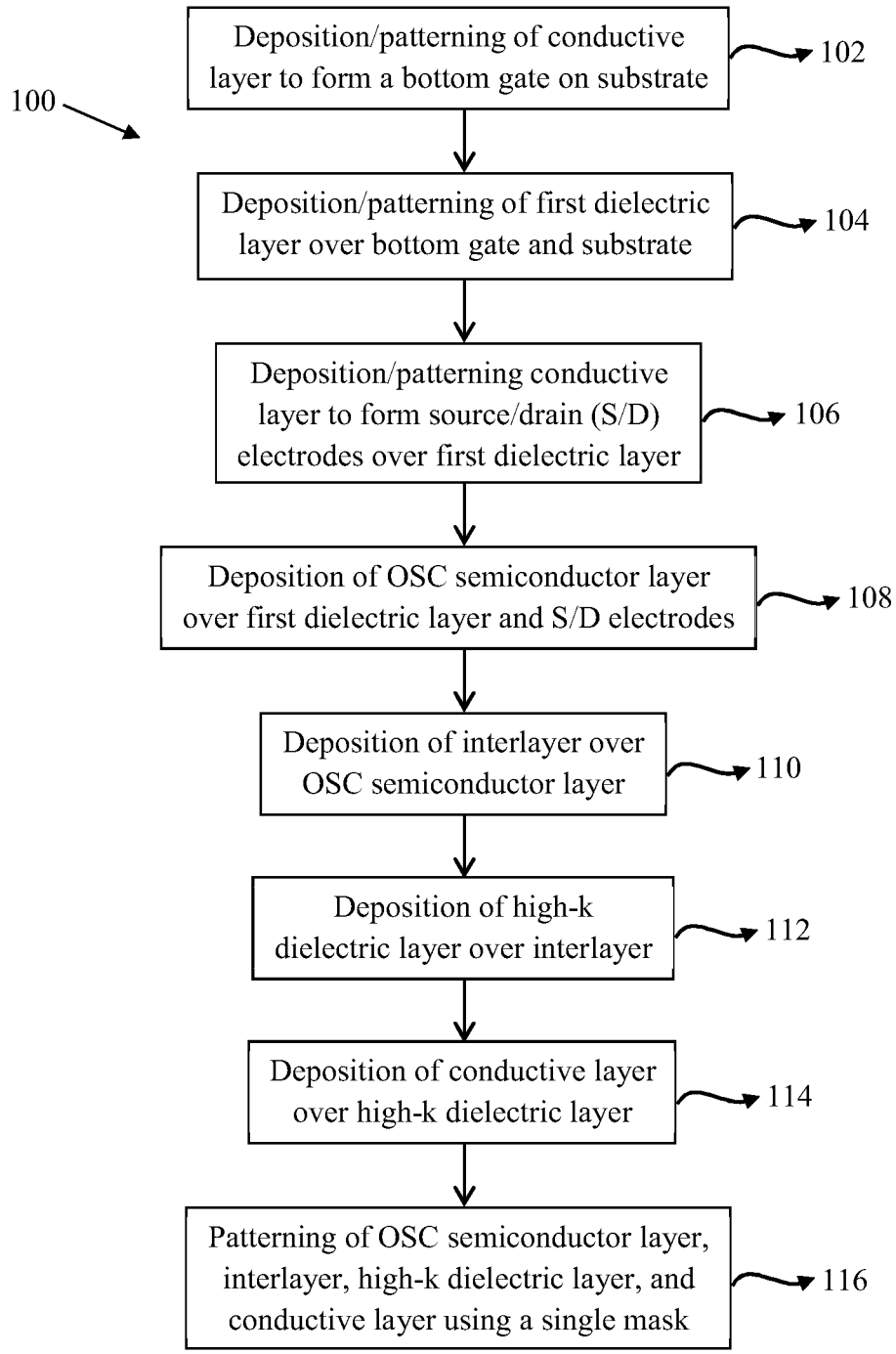
FIG. 1 illustrates a process flow diagram for forming a double-gate (DG) organic thin-film transistor (TFT), according to some embodiments.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments. It should be understood that the present application is not limited to the details or methodology set forth in the description or illustrated in the figures. It should also be understood that the terminology is for the purpose of description only and should not be regarded as limiting.

Additionally, any examples set forth in this specification are illustrative, but not limiting, and merely set forth some of the many possible embodiments of the claimed invention. Other suitable modifications and adaptations of the variety of conditions and parameters normally encountered in the field, and which would be apparent to those skilled in the art, are within the spirit and scope of the disclosure.

Definitions

The term "alkyl group" refers to a monoradical branched or unbranched saturated hydrocarbon chain having 1 to 40 carbon atoms. This term is exemplified by groups such as methyl, ethyl, n-propyl, isopropyl, n-butyl, isobutyl, t-butyl, pentyl, n-hexyl, n-heptyl, n-octyl, n-decyl, or tetradecyl, and the like. The alkyl group can be substituted or unsubstituted.

The term "substituted alkyl group" refers to: (1) an alkyl group as defined above, having 1, 2, 3, 4 or 5 substituents, typically 1 to 3 substituents, selected from the group consisting of alkenyl, alkynyl, alkoxy, aralkyl, aldehyde, cycloalkyl, cycloalkenyl, acyl, acylamino, acyl halide, acyloxy, amino, aminocarbonyl, alkoxycarbonylamino, azido, cyano, halogen, hydroxy, keto, thiocarbonyl, carboxy, carboxyalkyl, arylthiol, ester, heteroarylthio, heterocyclylthio, hydroxyl, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO₂-alkyl, —SO₂-aryl and —SO₂-heteroaryl, thioalkyl, vinyl ether. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, $CF_3$, amino, substituted amino, cyano, and $—S(O)_nR_{SO}$, where $R_{SO}$ is alkyl, aryl, or heteroaryl and n is 0, 1 or 2; or (2) an alkyl group as defined above that is interrupted by 1-10 atoms independently chosen from oxygen, sulfur and $NR_a$, where $R_a$ is chosen from hydrogen, alkyl, cycloalkyl, alkenyl, cycloalkenyl, alkynyl, aryl, heteroaryl and heterocyclyl. All substituents may be optionally further substituted by alkyl, alkoxy, halogen, $CF_3$, amino, substituted amino, cyano, or $—S(O)_n R_{SO}$, in which $R_{SO}$ is alkyl, aryl, or heteroaryl and n is 0, 1 or 2; or (3) an alkyl group as defined above that has both 1, 2, 3, 4 or 5 substituents as defined above and is also interrupted by 1-10 atoms as defined above. For example, the alkyl groups can be an alkyl hydroxy group, where any of the hydrogen atoms of the alkyl group are substituted with a hydroxyl group.

The term "alkyl group" as defined herein also includes cycloalkyl groups. The term "cycloalkyl group" as used herein is a non-aromatic carbon-based ring (i.e., carbocyclic) composed of at least three carbon atoms, and in some embodiments from three to 20 carbon atoms, having a single cyclic ring or multiple condensed rings. Examples of single ring cycloalkyl groups include, but are not limited to, cyclopropyl, cyclobutyl, cyclopentyl, cyclohexyl, cyclooctyl, and the like. Examples of multiple ring cycloalkyl groups include, but are not limited to, adamantanyl, bicyclo[2.2.1]heptane, 1,3,3-trimethylbicyclo[2.2.1]hept-2-yl, (2,3,3-trimethylbicyclo[2.2.1]hept-2-yl), or carbocyclic groups to which is fused an aryl group, for example indane, and the like. The term cycloalkyl group also includes a heterocycloalkyl group, where at least one of the carbon atoms of the ring is substituted with a heteroatom such as, but not limited to, nitrogen, oxygen, sulfur, or phosphorus.

The term "unsubstituted alkyl group" is defined herein as an alkyl group composed of just carbon and hydrogen.

The term "acyl" denotes a group —C(O)R$_{CO}$, in which R$_{CO}$ is hydrogen, optionally substituted alkyl, optionally substituted cycloalkyl, optionally substituted heterocyclyl, optionally substituted aryl, and optionally substituted heteroaryl.

The term "aryl group" as used herein is any carbon-based aromatic group (i.e., aromatic carbocyclic) such as having a single ring (e.g., phenyl) or multiple rings (e.g., biphenyl), or multiple condensed (fused) rings (e.g., naphthyl or anthryl). These may include, but are not limited to, benzene, naphthalene, phenyl, etc.

The term "aryl group" also includes "heteroaryl group," meaning a radical derived from an aromatic cyclic group (i.e., fully unsaturated) having 1, 2, 3, 4, 5, 6, 7, 8, 9, 10, 11, 12, 13, 14, or 15 carbon atoms and 1, 2, 3 or 4 heteroatoms selected from oxygen, nitrogen, sulfur, and phosphorus within at least one ring. In other words, heteroaryl groups are aromatic rings composed of at least three carbon atoms that has at least one heteroatom incorporated within the ring of the aromatic group. Such heteroaryl groups can have a single ring (e.g., pyridyl or furyl) or multiple condensed rings (e.g., indolizinyl, benzothiazolyl, or benzothienyl). Examples of heteroaryls include, but are not limited to, [1,2,4]oxadiazole, [1,3,4]oxadiazole, [1,2,4]thiadiazole, [1,3,4]thiadiazole, pyrrole, imidazole, pyrazole, pyridine, pyrazine, pyrimidine, pyridazine, indolizine, isoindole, indole, indazole, purine, quinolizine, isoquinoline, quinoline, phthalazine, naphthylpyridine, quinoxaline, quinazoline, cinnoline, pteridine, carbazole, carboline, phenanthridine, acridine, phenanthroline, isothiazole, phenazine, isoxazole, phenoxazine, phenothiazine, imidazolidine, imidazoline, triazole, oxazole, thiazole, naphthyridine, and the like as well as N-oxide and N-alkoxy derivatives of nitrogen containing heteroaryl compounds, for example pyridine-N-oxide derivatives.

Unless otherwise constrained by the definition for the heteroaryl substituent, such heteroaryl groups can be optionally substituted with 1 to 5 substituents, typically 1 to 3 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The aryl group can be substituted or unsubstituted. Unless otherwise constrained by the definition for the aryl substituent, such aryl groups can optionally be substituted with from 1 to 5 substituents, typically 1 to 3 substituents, selected from the group consisting of alkyl, alkenyl, alkynyl, alkoxy, aldehyde, cycloalkyl, cycloalkenyl, acyl, acylamino, acyloxy, amino, aminocarbonyl, alkoxycarbonylamino, azido, cyano, ester, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2. In some embodiments, the term "aryl group" is limited to substituted or unsubstituted aryl and heteroaryl rings having from three to 30 carbon atoms.

The term "aralkyl group" as used herein is an aryl group having an alkyl group or an alkylene group as defined herein covalently attached to the aryl group. An example of an aralkyl group is a benzyl group. "Optionally substituted aralkyl" refers to an optionally substituted aryl group covalently linked to an optionally substituted alkyl group or alkylene group. Such aralkyl groups are exemplified by benzyl, phenylethyl, 3-(4-methoxyphenyl)propyl, and the like.

The term "heteroaralkyl" refers to a heteroaryl group covalently linked to an alkylene group, where heteroaryl and alkylene are defined herein. "Optionally substituted heteroaralkyl" refers to an optionally substituted heteroaryl group covalently linked to an optionally substituted alkylene group. Such heteroalkyl groups are exemplified by 3-pyridylmethyl, quinolin-8-ylethyl, 4-methoxythiazol-2-ylpropyl, and the like.

The term "alkenyl group" refers to a monoradical of a branched or unbranched unsaturated hydrocarbon group typically having from 2 to 40 carbon atoms, more typically 2 to 10 carbon atoms and even more typically 2 to 6 carbon atoms and having 1-6, typically 1, double bond (vinyl). Typical alkenyl groups include ethenyl or vinyl (—CH=CH$_2$), 1-propylene or allyl (—CH$_2$CH=CH$_2$), isopropylene (—C(CH$_3$)=CH$_2$), bicyclo[2.2.1]heptene, and the like. When alkenyl is attached to nitrogen, the double bond cannot be alpha to the nitrogen.

The term "substituted alkenyl group" refers to an alkenyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "cycloalkenyl group" refers to carbocyclic groups of from 3 to 20 carbon atoms having a single cyclic ring or multiple condensed rings with at least one double bond in the ring structure.

The term "alkynyl group" refers to a monoradical of an unsaturated hydrocarbon, typically having from 2 to 40 carbon atoms, more typically 2 to 10 carbon atoms and even more typically 2 to 6 carbon atoms and having at least 1 and typically from 1-6 sites of acetylene (triple bond) unsaturation. Typical alkynyl groups include ethynyl, (—C≡CH), propargyl (or prop-1-yn-3-yl, —CH$_2$C≡CH), and the like. When alkynyl is attached to nitrogen, the triple bond cannot be alpha to the nitrogen.

The term "substituted alkynyl group" refers to an alkynyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$— alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "alkylene group" is defined as a diradical of a branched or unbranched saturated hydrocarbon chain, having 1, 2, 3, 4, 5, 6, 7, 8, 9, 10, 11, 12, 13, 14, 15, 16, 17, 18, 19 or 20 carbon atoms, typically 1-10 carbon atoms, more typically 1, 2, 3, 4, 5 or 6 carbon atoms. This term is exemplified by groups such as methylene (—CH$_2$—), ethylene (—CH$_2$CH$_2$—), the propylene isomers (e.g., —CH$_2$CH$_2$CH$_2$— and —CH(CH$_3$)CH$_2$—) and the like.

The term "substituted alkylene group" refers to: (1) an alkylene group as defined above having 1, 2, 3, 4, or 5 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2; or (2) an alkylene group as defined above that is interrupted by 1-20 atoms independently chosen from oxygen, sulfur and NR$_a$—, where R$_a$ is chosen from hydrogen, optionally substituted alkyl, cycloalkyl, cycloalkenyl, aryl, heteroaryl and heterocyclyl, or groups selected from carbonyl, carboxyester, carboxyamide and sulfonyl; or (3) an alkylene group as defined above that has both 1, 2, 3, 4 or 5 substituents as defined above and is also interrupted by 1-20 atoms as defined above. Examples of substituted alkylenes are chloromethylene (—CH(Cl)—), aminoethylene (—CH(NH$_2$)CH$_2$—), methylaminoethylene (—CH(NHMe)CH$_2$—), 2-carboxypropylene isomers (—CH$_2$CH(CO$_2$H)CH$_2$—), ethoxyethyl (—CH$_2$CH$_2$O—CH$_2$CH$_2$—), ethylmethylaminoethyl (—CH$_2$CH$_2$N(CH$_3$)CH$_2$CH$_2$—), and the like.

The term "alkoxy group" refers to the group R—O—, where R is an optionally substituted alkyl or optionally substituted cycloalkyl, or R is a group —Y—Z, in which Y is optionally substituted alkylene and Z is optionally substituted alkenyl, optionally substituted alkynyl; or optionally substituted cycloalkenyl, where alkyl, alkenyl, alkynyl, cycloalkyl and cycloalkenyl are as defined herein. Typical alkoxy groups are optionally substituted alkyl-O— and include, by way of example, methoxy, ethoxy, n-propoxy, iso-propoxy, n-butoxy, tert-butoxy, sec-butoxy, n-pentoxy, n-hexoxy, 1,2-dimethylbutoxy, trifluoromethoxy, and the like.

The term "alkylthio group" refers to the group R$_S$—S—, where R$_S$ is as defined for alkoxy.

The term "aminocarbonyl" refers to the group —C(O)NR$_N$R$_N$ where each R$_N$ is independently hydrogen, alkyl, aryl, heteroaryl, heterocyclyl or where both R$_N$ groups are joined to form a heterocyclic group (e.g., morpholino). Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "acylamino" refers to the group —NR$_{NCO}$C(O)R where each R$_{NCO}$ is independently hydrogen, alkyl, aryl, heteroaryl, or heterocyclyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "acyloxy" refers to the groups —O(O)C-alkyl, —O(O)C-cycloalkyl, —O(O)C-aryl, —O(O)C-heteroaryl, and —O(O)C-heterocyclyl. Unless otherwise constrained by the definition, all substituents may be optionally further substituted by alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "aryloxy group" refers to the group aryl-O— wherein the aryl group is as defined above, and includes optionally substituted aryl groups as also defined above.

The term "heteroaryloxy" refers to the group heteroaryl-O—.

The term "amino" refers to the group —NH$_2$.

The term "substituted amino" refers to the group —NR$_w$R$_w$ where each R$_w$ is independently selected from the group consisting of hydrogen, alkyl, cycloalkyl, carboxyalkyl (for example, benzyloxycarbonyl), aryl, heteroaryl and heterocyclyl provided that both R$_w$ groups are not hydrogen, or a group —Y—Z, in which Y is optionally substituted alkylene and Z is alkenyl, cycloalkenyl, or alkynyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "carboxy" refers to a group —C(O)OH. The term "carboxyalkyl group" refers to the groups —C(O)O-alkyl or —C(O)O-cycloalkyl, where alkyl and cycloalkyl, are as defined herein, and may be optionally further substituted by alkyl, alkenyl, alkynyl, alkoxy, halogen, CF$_3$, amino, substituted amino, cyano, and —S(O)$_n$R$_{SO}$, in which R$_{SO}$ is alkyl, aryl, or heteroaryl and n is 0, 1 or 2.

The terms "substituted cycloalkyl group" or "substituted cycloalkenyl group" refer to cycloalkyl or cycloalkenyl groups having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "conjugated group" is defined as a linear, branched or cyclic group, or combination thereof, in which p-orbitals of the atoms within the group are connected via delocalization of electrons and wherein the structure can be described as containing alternating single and double or triple bonds and may further contain lone pairs, radicals, or carbenium ions. Conjugated cyclic groups may comprise both aromatic and non-aromatic groups, and may comprise polycyclic or heterocyclic groups, such as diketopyrrolopyrrole. Ideally, conjugated groups are bound in such a way as to continue the conjugation between the thiophene moieties they connect. In some embodiments, "conjugated groups" is limited to conjugated groups having three to 30 carbon atoms.

The term "halogen," "halo," or "halide" may be referred to interchangeably and refer to fluoro, bromo, chloro, and iodo.

The term "heterocyclyl" refers to a monoradical saturated or partially unsaturated group having a single ring or multiple condensed rings, having from 1 to 40 carbon atoms and from 1 to 10 hetero atoms, typically 1, 2, 3 or 4 heteroatoms, selected from nitrogen, sulfur, phosphorus, and/or oxygen within the ring. Heterocyclic groups can have a single ring or multiple condensed rings, and include tetrahydrofuranyl, morpholino, piperidinyl, piperazino, dihydropyridino, and the like.

Unless otherwise constrained by the definition for the heterocyclyl substituent, such heterocyclyl groups can be optionally substituted with 1, 2, 3, 4 or 5, and typically 1, 2 or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "thiol" refers to the group —SH. The term "substituted alkylthio" refers to the group —S-substituted alkyl. The term "arylthiol group" refers to the group aryl-S—, where aryl is as defined as above. The term "heteroarylthiol" refers to the group —S-heteroaryl wherein the heteroaryl group is as defined above including optionally substituted heteroaryl groups as also defined above.

The term "sulfoxide" refers to a group —S(O)R$_{SO}$, in which R$_{SO}$ is alkyl, aryl, or heteroaryl. The term "substituted sulfoxide" refers to a group —S(O)R$_{SO}$, in which R$_{SO}$ is substituted alkyl, substituted aryl, or substituted heteroaryl, as defined herein. The term "sulfone" refers to a group —S(O)$_2$R$_{SO}$, in which R$_{SO}$ is alkyl, aryl, or heteroaryl. The term "substituted sulfone" refers to a group —S(O)$_2$R$_{SO}$, in which R$_{SO}$ is substituted alkyl, substituted aryl, or substituted heteroaryl, as defined herein.

The term "keto" refers to a group —C(O)—. The term "thiocarbonyl" refers to a group —C(S)—.

As used herein, the term "room temperature" is 20° C. to 25° C.

Disclosed are compounds, compositions, and components that can be used for, can be used in conjunction with, can be used in preparation of, or are products of the disclosed methods and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of molecules A, B, and C are disclosed as well as a class of molecules D, E, and F and an example of a combination molecule, A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

A weight percent of a component, unless specifically stated to the contrary, is based on the total weight of the formulation or composition in which the component is included.

Organic thin-film transistors are particularly interesting because their fabrication processes are less complex as compared with conventional silicon-based technologies. For example, OTFTs generally rely on low temperature deposition and solution processing, which, when used with semiconducting conjugated polymers, can achieve valuable technological attributes, such as compatibility with simple-write printing techniques, general low-cost manufacturing approaches, and flexible plastic substrates. Other potential applications for OTFTs include flexible electronic papers, sensors, memory devices (e.g., radio frequency identification cards (RFIDs)), remote controllable smart tags for supply chain management, large-area flexible displays, and smart cards.

Figure 2:
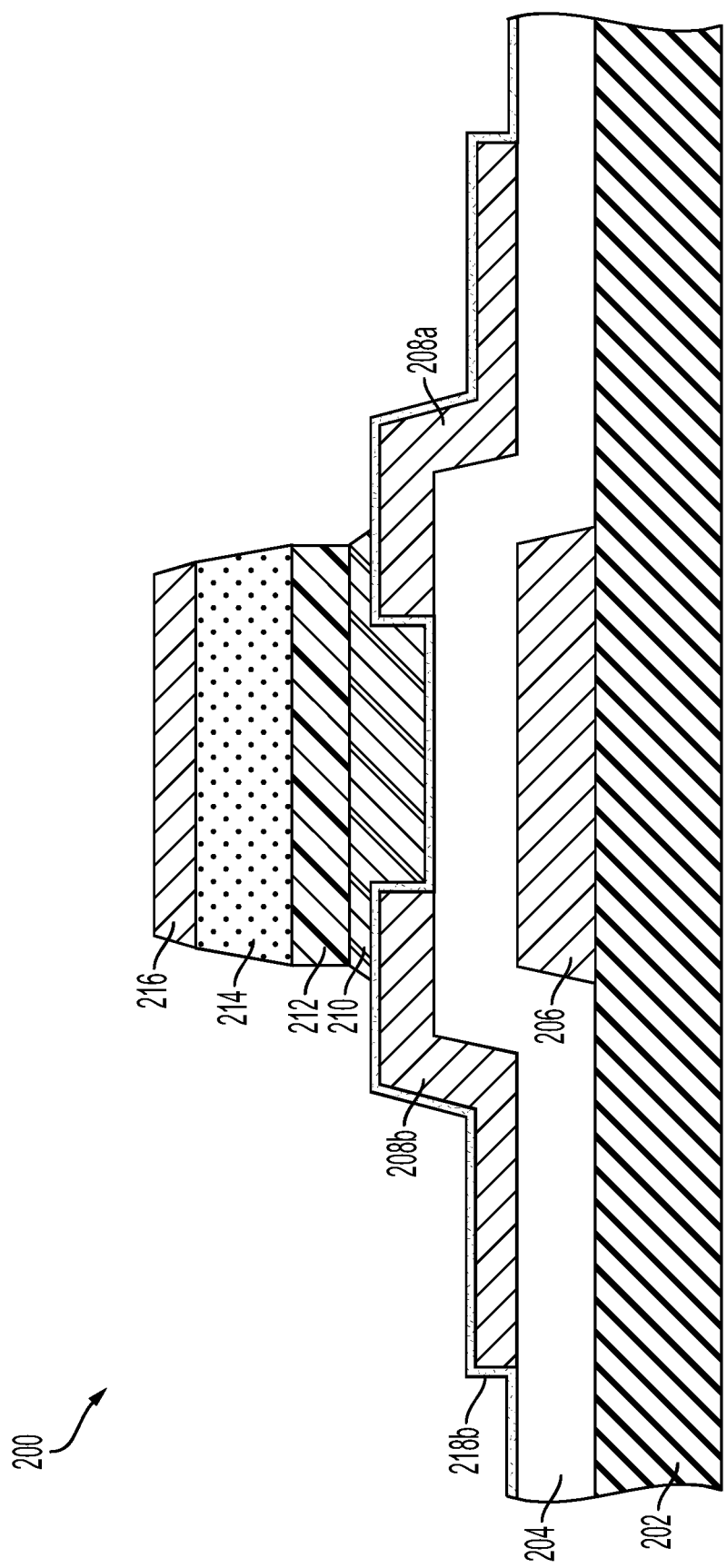
FIG. 2 illustrates a double-gate (DG) field-effect transistor structure, according to some embodiments.

Turning now to the figures, FIG. 1 illustrates a process flow diagram 100 for forming a double-gate (DG) organic thin-film transistor (TFT), according to some embodiments. FIG. 2 illustrates a double-gate (DG) field-effect transistor structure, according to some embodiments.

In a first step 102, a conductive layer is deposited over a substrate 202 and patterned (mask 1) to form a bottom gate 206 having a predetermined gate length L.

The substrate may be at least one of organics (e.g., polypropylene carbonate, polyvinyl alcohol, poly(lactic acid), polycaprolactone, polyimide, polyethylene naphthalate, polyesters, polyethylene terephthalate, etc.), inorganics (e.g., silicon wafers, GaAs, glasses, ceramics, glass-ceramics, fibers, etc.), non-toxic and biodegradable materials obtained from nature (e.g., paper, chitin, silk, gelatin, shellac, collagen, cellulose-based polymers, etc.), or combinations thereof. The bottom gate may be formed of at least one of metals (Al, Ti, V, Cr, Zr, Nb, Mo, Hf, Ta, W, Ru, Rh, Pd, Pt, Ir, Os, Cu, Ag, Au, etc.), metal oxides, alloys, transparent conductive oxides (TCO) (e.g., ITO), organics (e.g., poly(3,4-ethylene dioxythiophene) (PEDOT); eumelanin; 3,4-dihydroxy-1-phenylalanine (I-DOPA); poly(ethylene-dioxythiophene)/polystyrene sulfonated (PEDOT/PSS); poly(3,4-thylenedioxythiophene); polyaniline; polythiophene; polypyrrole; poly(3,4-thylenedioxythiophene); polyaniline/camphor-sulphonic acid (PANI/CSA); etc.), or combinations thereof.

In a second step 104, a first dielectric layer 204 is disposed over the bottom gate 206 and substrate 202 and patterned (mask 2) to form a bottom gate insulator.

The first dielectric layer may be an insulating material used to prevent leakage current between the bottom gate and active layer. Accumulation of charge carriers at the semiconductor/insulator interface depends on dielectric constant and the thickness of the insulator. The material used for the first dielectric layer should properly adhere to the substrate and enable a good interface with the semiconductor to avoid the generation of dipoles and trap states. High-k insulating materials are beneficial in attaining a steep sub-threshold slope and low threshold voltage due to their smaller band gaps as compared to the low-k materials. In some examples, the first dielectric layer may be at least one of $La_2O_3$, $HfSiO_x$, HfLaO, $LaAlO_3$, $Pr_6O_{11}$, $HfO_2$, $Al_2O_3$, $SiO_2$, SiN, MgO, $TiO_2$, $CeO_2$, $Ta_2O_3$, $Nd_2O_3$, polyvinyl propylene (PVP), $ZrO_2$, poly(4-vinylpyridine) (P4VP), poly(methyl methacrylate) (PMMA), barium zirconate titanate (BZT), polyvinylidene fluoride (PVDF), $HfO_2$, propylene, polystyrene (PS), polyimide (PI), polyvinyl alcohol (PVA), or combinations thereof. In some examples, the first dielectric layer may be bi-layers of insulating films.

In a third step 106, a conductive layer is deposited over the first dielectric layer 204 and patterned (mask 3) to form source/drain (S/D) electrodes 208a and 208b, thereby creating a window opening to expose the first dielectric layer to subsequently deposited layers. In some examples, the S/D electrodes may be independently selected from the materials listed above for the bottom electrode. Optionally, after forming the S/D electrodes, a polymeric self-assembled monolayer 218 may be disposed over the first dielectric layer 204 and S/D electrodes 208a and 208b for enhancing film quality and adhesion characteristics of the OSC semiconductor layer 210, which is deposited in a fourth step 108. In some examples, the polymeric SAM may be at least one of octadecyltrimethoxysilane (OTS), hexamethyldisilazane (HMDS), octadecylphosphonic acid (ODPA), or combinations thereof.

In some examples, the OSC semiconductor layer is formed as described herein.

An OSC polymer may be used to produce the OSC layer. In some examples, a polymer blend comprises an organic semiconductor polymer. In some examples, the OSC polymer has a main backbone that is fully conjugated. In some examples, the OSC is a diketopyrrolopyrrole (DPP) fused thiophene polymeric material. In some examples, the fused thiophene is beta-substituted. This OSC may contain both fused thiophene and diketopyrrolopyrrole units.

For example, the OSC polymer may comprise the repeat unit of Formula 1 or Formula 2, or a salt, isomer, or analog thereof:

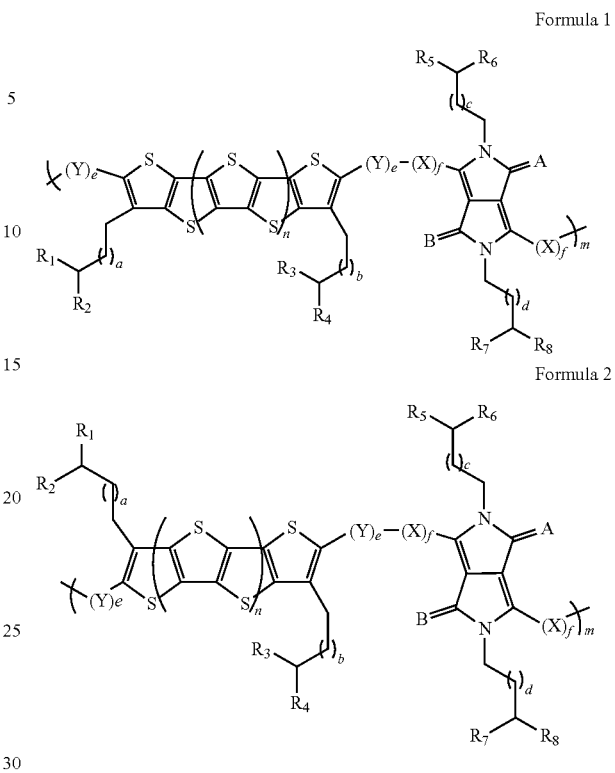

Formula 1

Formula 2 wherein in Formula 1 and Formula 2: m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (iv) the polymer having a molecular weight, wherein the molecular weight of the polymer is greater than 10,000.

In some embodiments, the OSC polymers defined in Formula 1 or Formula 2 enable simple transistor fabrication at relatively low temperatures, which is particularly important for the realization of large-area, mechanically flexible electronics. A beta-substituted OSC polymer can also help to improve solubility.

In some examples, the OSC polymer may comprise a first portion and a second portion, such that at least one of the first portion or the second portion comprises at least one UV-curable side chain. In some examples, the at least one UV-curable side chain comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof. In some examples, only the first portion comprises the at least one UV-curable side chain. In some examples, only the second portion comprises the at least one UV-curable side chain. In some examples, both the first portion and the second portion comprise the at least one UV-curable side chain.

In some examples, such as when the first portion comprises the at least one UV-curable side chain, the second portion comprises a repeat unit of Formulas 3-6, or a salt, isomer, or analog thereof. In some examples, such as when the second portion comprises the at least one UV-curable side chain, the first portion comprises a repeat unit of Formulas 3-6, or a salt, isomer, or analog thereof. In some examples, $R_5$ and $R_7$ are hydrogen and $R_6$ and $R_8$ are substituted or unsubstituted $C_4$ or greater alkenyl in the first portion and the second portion comprises a repeat unit of Formulas 3-6, or a salt, isomer, or analog thereof. In some examples, $R_5$ and $R_7$ are hydrogen and $R_6$ and $R_8$ are substituted or unsubstituted $C_4$ or greater alkenyl in the first portion and the second portion. In some examples, at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof. In some examples, at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

Formula 3

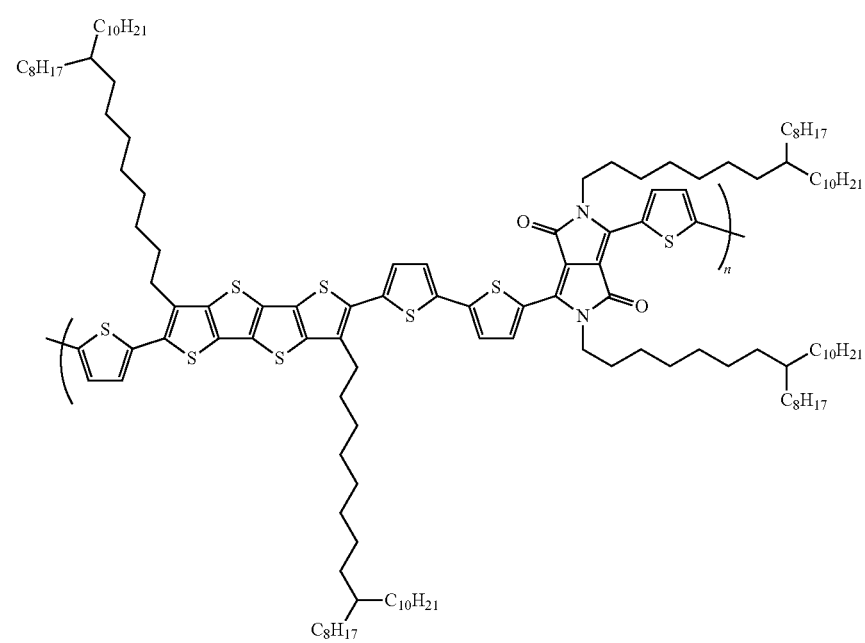

Formula 4

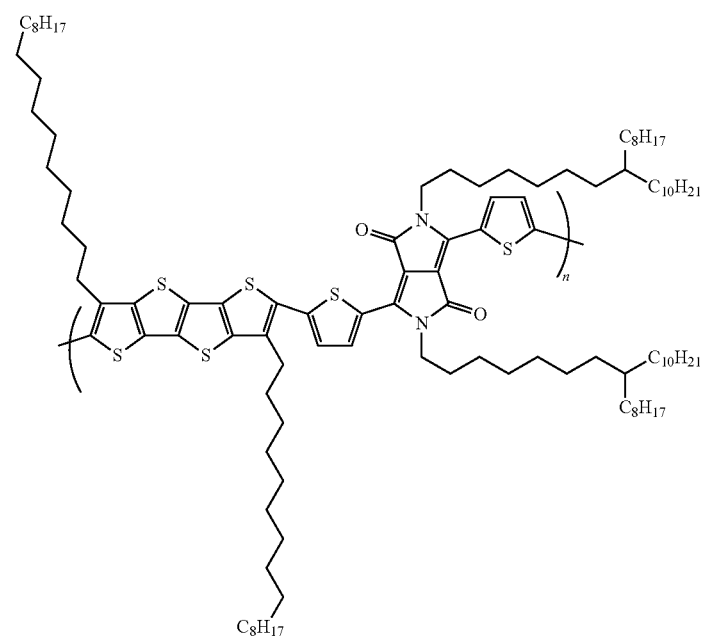

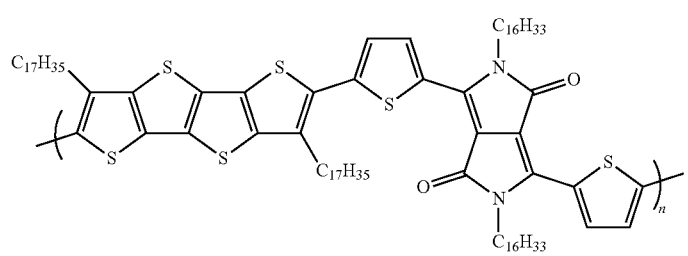

Formula 5

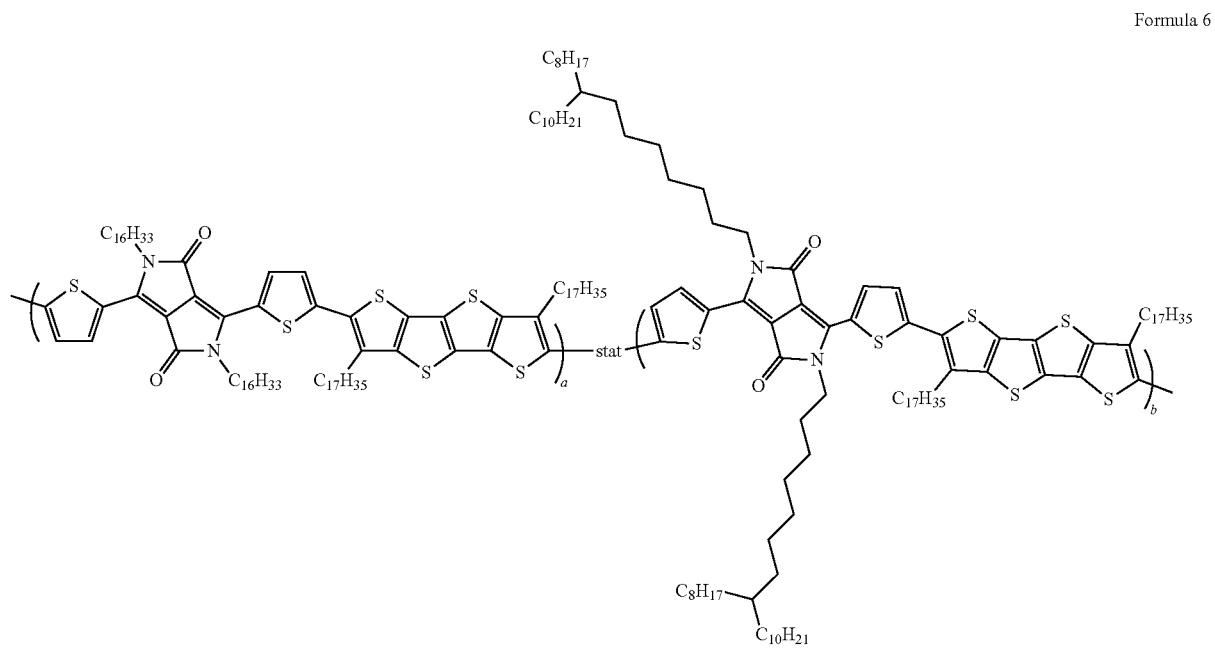

Formula 6

In some examples, the OSC has a solubility of 0.5 mg/mL, 1 mg/mL, 2 mg/mL, 3 mg/mL, 4 mg/mL, 5 mg/mL, 10 mg/mL, 15 mg/mL, 20 mg/mL, 25 mg/mL, 30 mg/mL, 35 mg/mL, 40 mg/mL, or any value therein, or any range defined by any two of those endpoints. In some examples, the OSC has a solubility of 1 mg/mL or more at room temperature.

In some examples, the OSC has hole mobilities of 1 $cm^2V^{-1}s^{-1}$, 2 $cm^2V^{-1}s^{-1}$, 3 $cm^2V^{-1}s^{-1}$, 4 $cm^2V^{-1}s^{-1}$, 5 $cm^2V^{-1}s^{-1}$, 10 $cm^2V^{-1}s^{-1}$, 15 $cm^2V^{-1}s^{-1}$, 20 $cm^2V^{-1}s^{-1}$, 25 $cm^2V^{-1}s^{-1}$, 30 $cm^2V^{-1}s^{-1}$, 35 $cm^2V^{-1}s^{-1}$, 40 $cm^2V^{-1}s^{-1}$, or any value therein, or any range defined by any two of those endpoints. The hole mobilities may be equal to or greater than any of these values. In some examples, the OSC has hole mobilities of 1 to 4 $cm^2V^{-1}s^{-1}$. In some examples, the OSC has hole mobilities of 2 $cm^2V^{-1}s^{-1}$. In some examples, the OSC has hole mobilities of 2 $cm^2V^{-1}s^{-1}$ or more.

In some examples, the OSC polymers have On/Off ratios of greater than $10^5$. In some examples, the OSC polymers have On/Off ratios of greater than $10^6$.

In some examples, the OSC polymers have a threshold voltage in thin film transistor devices of −20V, −15V, −10V, −5V, −4V, −3V, −2V, −1V, 0V, 1V, 2V, 3V, 4V, 5V, 10V, 15V, 20V, or any value therein or any range defined by any two of those endpoints. In some examples, the OSC polymers have a threshold voltage in a range of 1 V to 3 V in thin film transistor devices. In some examples, the OSC polymers have a threshold voltage of 2 V in thin film transistor devices.

The OSC polymer disclosed herein (e.g., with at least one UV-curable side chain), enables direct UV crosslinking and patterning, thereby leading to improved patterning effects and OFET devices performance. The disclosed cross-bred OSC polymers having the at least one UV-curable side chain do not have phase separation issues and have stronger solvent resistance due to covalent-bond crosslinking. Thus, they are easier to process, leading to better reproducibility for solution processable OSC thin films. The chemical and physical properties of the cross-bred OSC polymers disclosed herein are also highly tunable by manipulating ratios among different monomers. The crosslinked OSC polymer networks formed using the disclosed cross-bred OSC polymers having the at least one UV-curable side chain helps polymer chain alignment at elevated temperatures, offering higher temperature resistance of OTFT devices made thereof, as well as longer device life time and higher weatherability.

In some examples, a polymer blend comprises at least one OSC polymer and at least one crosslinker, such that the crosslinker includes at least one of: acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or a combination thereof. In some examples, the at least one crosslinker comprises C=C bonds, thiols, oxetanes, halides, azides, or combinations thereof.

In some examples, the crosslinker may be a small molecule or a polymer that reacts with the OSC polymer by one or a combination of reaction mechanisms, depending on functional moieties present in the crosslinker molecule. For example, crosslinkers comprising thiol groups may react with double bonds in the OSC polymer via thiol-ene click chemistry. In some examples, crosslinkers comprising vinyl groups may react with double bonds in the OSC polymer via addition reaction. In some examples, crosslinkers (comprising thiols, vinyl groups, etc., or combinations thereof) may react with crosslinkable functionalities incorporated in the side chains of OSC polymers. These include, for example, acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In some examples, a polymer blend comprises at least one OSC polymer, at least one crosslinker, and at least one photoinitiator. The photoinitiator is a key component of photocuring products. In some examples, the photoinitiator comprises at least one free radical photoinitiator, which include reactive free radicals that initiate photo-polymerization when exposed to UV light. In some examples, the photoinitiator comprises at least one cationic photoinitiator (photo-acid generators (PAGs)). Once a cationic photoinitiator absorbs UV light, the initiator molecule is converted into a strong acid species, either a Lewis or Brönsted acid, that initiates polymerization. Typical photoacids/photoacid generators include aryl diazo salts, diaryliodonium salts, triaryl sulfonium salts, and aryl ferrocenium salts.

In some examples, the at least one photoinitiator includes: 1-hydroxy-cyclohexyl-phenyl-ketone (184); 2-benzyl-2-dimethylamino-1-(4-morpholinophenyl)-butanone-1 (369); diphenyl(2,4,6-trimethylbenzoyl)phosphine oxide (TPO); 2-isopropyl thioxanthone (ITX); 1-[4-(phenylthio) phenyl]-1,2-octanedione 2-(O-benzoyloxime) (HRCURE-OXE01); 2,2-dimethoxy-1,2-diphenylethan-1-one (BDK); benzoyl peroxide (BPO); hydroxyacetophenone (HAP); 2-hydroxy-2-methylprophenone (1173); 2-methyl-4'-(methylthio)-2-morpholinopropiophenone (907); 2-benzyl-2-(dimethylamino)-4'-morpholinobutyrophenone (IHT-PI 910); Ethyl-4-(dimethylamino)benzoate (EDB); methyl o-benzoyl benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thioxanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4(methylthiol) phenyl]-2-morpholino propanone (1) (MMMP); 4-phenyl-benzophenone (PBZ); 2,4,6-trimethyl-benzoly-ethoxyl phenyl phosphine oxide (TEPO); bis(4-tert-butylphenyl) iodonium perfluoro-1-butanesulfonate; bis(4-tert-butylphenyl) iodonium p-toluenesulfonate; bis(4-tert-butylphenyl) iodonium triflate; boc-methoxyphenyldiphenylsulfonium triflate; (4-tert-Butylphenyl) diphenylsulfonium triflate; diphenyliodonium hexafluorophosphate; diphenyliodonium nitrate; diphenyliodonium p-toluenesulfonate; diphenyliodonium triflate; (4-fluorophenyl) diphenylsulfonium triflate; N-hydroxynaphthalimide triflate; N-hydroxy-5-norbornene-2,3-dicarboximide perfluoro-1-butanesulfonate; (4-iodophenyl) diphenylsulfonium triflate; (4-methoxyphenyl) diphenylsulfonium triflate; 2-(4-Methoxystyryl)-4,6-bis(trichloromethyl)-1,3,5-triazine; (4-methylthiophenyl) methyl phenyl sulfonium triflate; 1-naphthyl diphenylsulfonium triflate; (4-phenoxyphenyl) diphenylsulfonium triflate; (4-phenylthiophenyl) diphenylsulfonium triflate; triarylsulfonium hexafluoroantimonate salts, mixed 50 wt. % in propylene carbonate; triarylsulfonium hexafluorophosphate salts, mixed 50 wt. % in propylene carbonate; triphenylsulfonium perfluoro-1-butanesufonate; triphenylsulfonium triflate; tris(4-tert-butylphenyl) sulfonium perfluoro-1-butanesulfonate; tris(4-tert-butylphenyl)sulfonium triflate; aryl diazo salts; diaryliodonium salts; triaryl sulfonium salts; aryl ferrocenium salts; or combinations thereof.

In some examples, a polymer blend comprises at least one OSC polymer, at least one crosslinker, at least one photoinitiator, and at least one additive, such as antioxidants (i.e., oxygen inhibitors), lubricants, compatibilizers, leveling agents, nucleating agents, or combinations thereof. In some examples, oxygen inhibitors include phenols, thiols, amines, ethers, phosphites, organic phosphines, hydroxylamines, or combinations thereof.

In some examples, the performance of a device comprising the OSC polymer may be improved by blending the OSC polymer with a crosslinker. In some examples, the OSC polymer is blended with a crosslinker in a solvent. In some examples, the solvent is chloroform, methylethylketone, toluene, xylenes, chlorobenzene, 1,2-dichlorobenzene, 1,2,4-trichlorobenzene, tetralin, naphthalene, chloronaphthalene, or combinations thereof. In some examples, a mixture of more than one solvent may be used.

In some examples, the blend consists of OSC polymers as described herein. In some examples, the blend comprises at least two of: OSC polymers, crosslinkers, photoinitiators, and additives as described herein. In some examples, the blend comprises at least three of: OSC polymers, crosslinkers, photoinitiators, and additives as described herein. In some examples, the blend comprises at least four of: OSC polymers, crosslinkers, photoinitiators, and additives as described herein.

Subsequently, an interlayer 212 is deposited over the OSC semiconductor layer 210 in a fifth step 110, a high-k dielectric 214 is deposited over the interlayer in a sixth step 112 and a conductive layer 216 is deposited over the high-k dielectric layer in a seventh step 114.

In some examples, the interlayer is described herein.

A thin interlayer may be deposited between the OSC semiconductor layer and a high-k dielectric as a top gate insulator. This inclusion may serve to significantly reduce or eliminate device degradation, thereby allowing for fabrication of good quality DG OTFTs. For example, the interlayer may provide a smooth interface with the OSC semiconductor layer and may reduce vertical leakage current. Additionally, the interlayer may also aide in passivating back channel electronic defects (e.g., electron trap states) of the OTFT and improving transfer characteristics, particularly at which higher drain biases are applied.

In some examples, the interlayer may be formed of at least one of polymethyl methacrylate (PMMA), poly(p-xylylene) polymers (e.g., parylene), polystyrene, polyimide, poly(3-dodecylthiophene-2,5-diyl) (P3DDT), polyvinyl phenol, polyvinyl alcohol, poly (4-vinyl phenol) (P4VP), polyacrylic acid, or combinations or copolymers thereof (e.g., P4VP-co-PMMA) (see Table 1 below).

TABLE 1

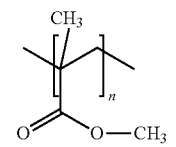

Polymethyl methacrylate (PMMA)

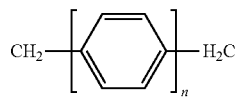

Parylene

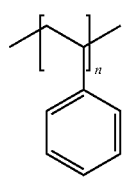

Polystyrene

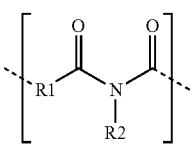

Polyimide

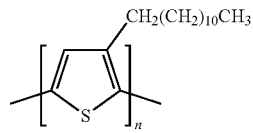

Poly(3-dodecylthiophene-2,5-diyl)

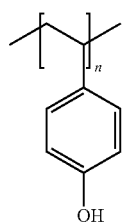

Polyvinyl phenol

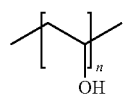

Polyvinyl alcohol

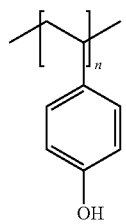

Poly (4-vinyl phenol)

TABLE 1-continued

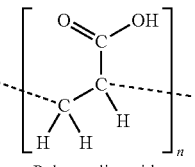

Polyacrylic acid

In some examples, the interlayer may be deposited by spin coating (e.g., for PMMA) and heat treating to remove solvent (e.g., methyl-ethyl-ketone, MEK) such that the remaining thickness of interlayer is in a range of 0.1 nm to 500 nm, or 0.5 nm to 250 nm, or 1 nm to 100 nm, or 0.1 nm to 250 nm, or 1 nm to 125 nm, or 5 nm to 50 nm, or 10 nm to 25 nm, or 250 nm to 500 nm, or 300 nm to 450 nm, or 350 nm to 400 nm. In some examples, the interlayer may be deposited by thermal evaporation (e.g., for parylene) such that the remaining thickness of interlayer is in a range of 0.1 nm to 500 nm, or 0.5 nm to 250 nm, or 1 nm to 100 nm, or 0.1 nm to 250 nm, or 1 nm to 125 nm, or 5 nm to 50 nm, or 10 nm to 25 nm, or 250 nm to 500 nm, or 300 nm to 450 nm, or 350 nm to 400 nm.

In some examples, the high-k dielectric is described herein.

A high-k dielectric may be used as a top gate insulator to achieve higher current driving capability under a low voltage (5V) and which may exhibit a double-layer capacitance effect. The high-k dielectric may be deposited by spin coating and heat treating to remove solvent such that the remaining thickness of interlayer is in a range of 0.1 nm to 5000 nm, 0.5 nm to 2500 nm, 1 nm to 1000 nm, 0.1 nm to 2500 nm, 1 nm to 1250 nm, 5 nm to 500 nm, 10 nm to 250 nm, 500 nm to 2500 nm, 500 nm to 1000 nm, 2500 nm to 5000 nm, 3000 nm to 4500 nm, 3500 nm to 4000 nm. In some examples, the high-k dielectric may be formed of at least one of polyvinylidene fluoride-hexafluoropropylene (PVDF-HFP), alkali ion (e.g., Li, Na, K, etc.)-containing polyacrylic acid, or combinations thereof.

With respect to conductive layer 216, materials may be independently selected from the materials listed above for the bottom electrode.

Finally, in an eighth step 116, the OSC semiconductor layer 210, interlayer 212, high-k dielectric layer 214, and conductive layer 216 are patterned using a single mask (mask 4) to form the final DG-OFET structure of FIG. 2. In this manner, the OSC semiconductor materials remains protected from exposure to chemical solvents during patterning, thereby improving stability of OTFT through passivation by the top gate insulator (e.g., interlayer and high-k dielectric). Moreover, by simultaneously controlling the bottom gate and top gate, the DG-driving OTFT shows advantages of higher saturation current, larger on-to-off current ratio ($I_{ON}/I_{OFF}$), and lower sub-threshold slope (SS) while covering the same spatial area as that of single gate (SG) TFTs. Together with excellent stability, uniformity, and compatibility with photolithographic patterning processes, the DG-driving OTFT, as formed herein, may be a promising candidate for organic TFT-based display backplanes.

Figure 3:
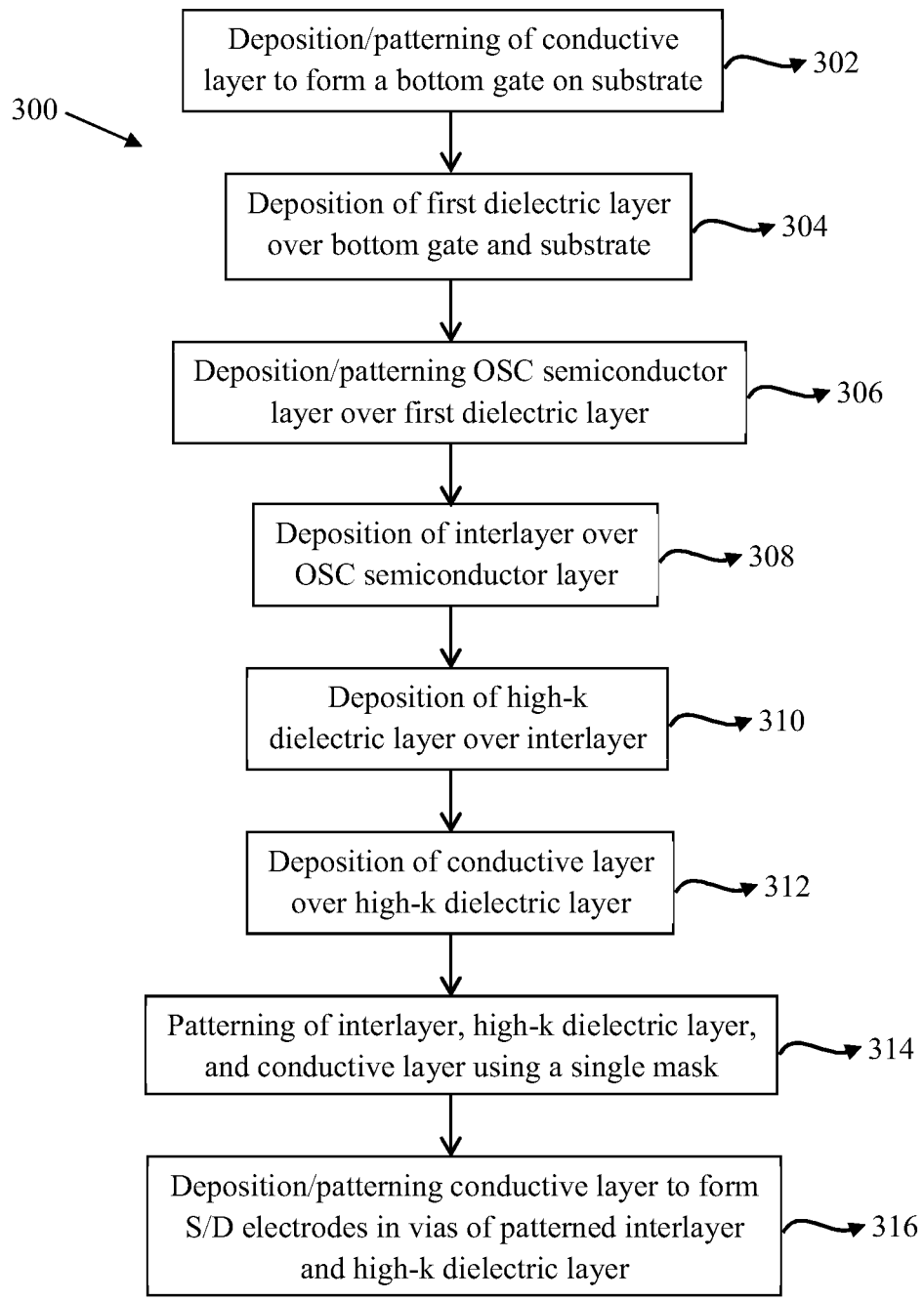
FIG. 3 illustrates a process flow diagram for forming a double-gate (DG) organic thin-film transistor (TFT), according to some embodiments.
Figure 5:
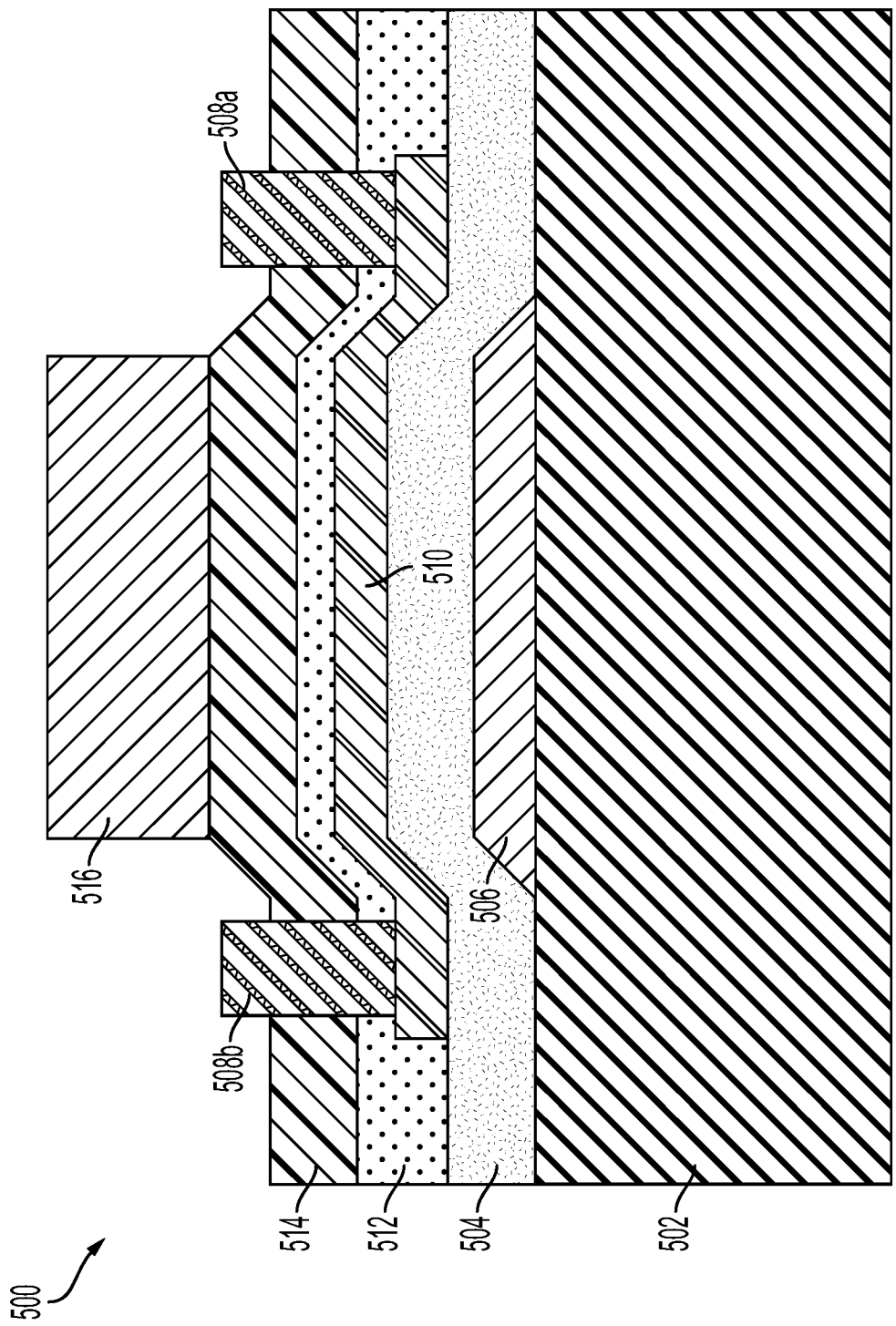
FIG. 5 illustrates a double-gate (DG) field-effect transistor structure, according to some embodiments.

FIG. 3 illustrates a process flow diagram 300 for forming a double-gate (DG) organic thin-film transistor (TFT), according to some embodiments. FIG. 5 illustrates a double-gate (DG) field-effect transistor structure, according to some embodiments.

In a first step 302, a conductive layer is deposited over a substrate 502 and patterned to form a bottom gate 506 having a predetermined gate length L. In a second step 304, a first dielectric layer 504 is disposed over the bottom gate 506 and substrate 502 to form a bottom gate insulator. In a third step 306, an OSC semiconductor layer 510 is disposed over the first dielectric layer 504 and patterned to form an active layer. In steps four to six (308, 310, and 312, respectively), an interlayer 512 is deposited over the OSC semiconductor layer 510, a high-k dielectric 514 is deposited over the interlayer, and a conductive layer 516 is deposited over the high-k dielectric layer, respectively. Thereafter, in step seven 314, the interlayer 512, high-k dielectric 514, and conductive layer 516 are patterned using a single mask. Finally, a conductive layer is deposited in step eight 316 to form source/drain (S/D) electrodes 508a and 508b to form the final DG-OFET structure of FIG. 5.

Figure 4:
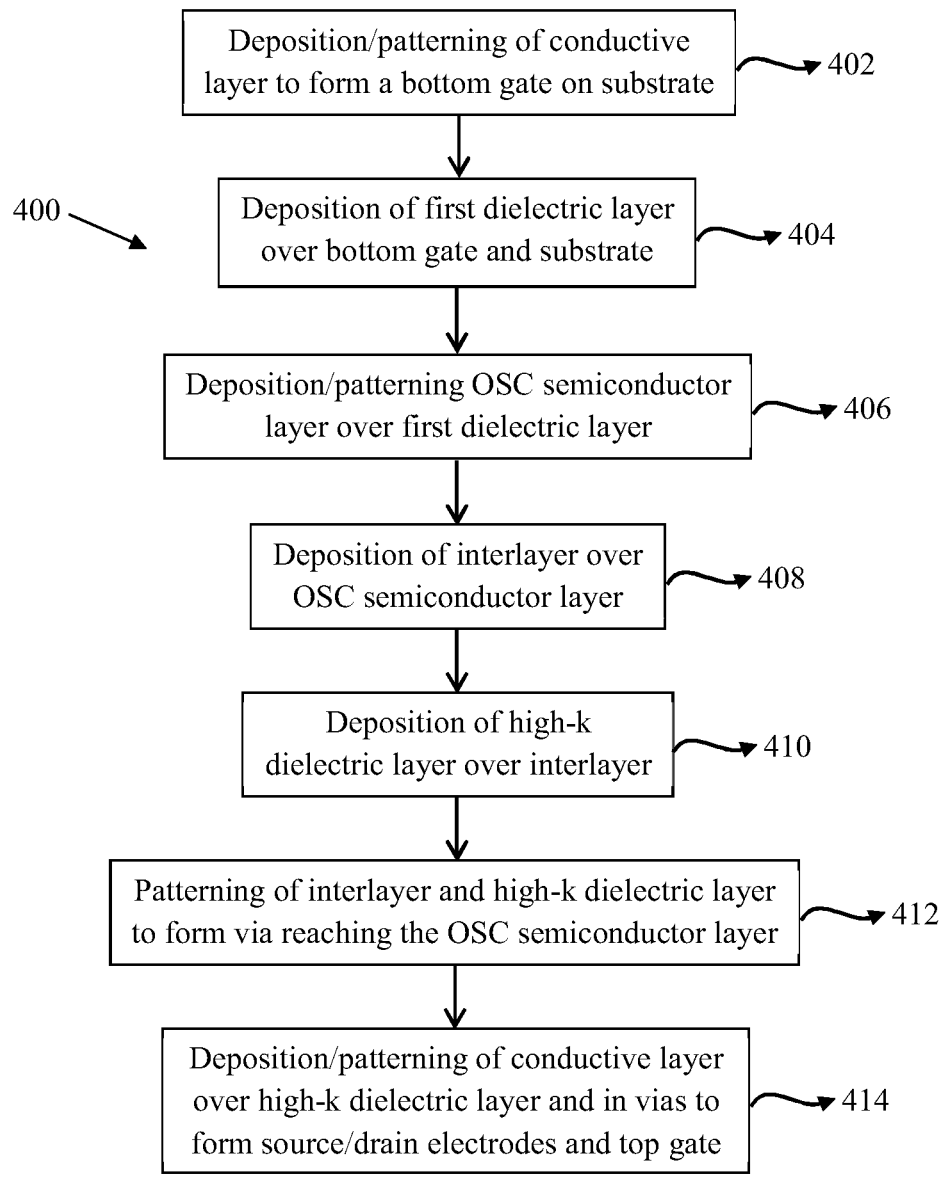
FIG. 4 illustrates a process flow diagram for forming a double-gate (DG) organic thin-film transistor (TFT), according to some embodiments.

FIG. 4 illustrates a process flow diagram 400 for forming a double-gate (DG) organic thin-film transistor (TFT), according to some embodiments. In a first step 402, a conductive layer is deposited over a substrate 502 and patterned to form a bottom gate 506 having a predetermined gate length L. In a second step 404, a first dielectric layer 504 is disposed over the bottom gate 506 and substrate 502 to form a bottom gate insulator. In a third step 406, an OSC semiconductor layer 510 is disposed over the first dielectric layer 504 and patterned to form an active layer. In steps four 408 and five 410, an interlayer 512 is deposited over the OSC semiconductor layer 510 and a high-k dielectric 514 is deposited over the interlayer, respectively. In a sixth step 412, the interlayer 512 and high-k dielectric 514 are patterned using a single mask to form vias reaching the OSC semiconductor layer. Finally, a conductive layer is deposited in step seven 414 to form source/drain (S/D) electrodes 508a and 508b and top gate 516 to form the final DG-OFET structure of FIG. 5.

EXAMPLES

The embodiments described herein will be further clarified by the following examples.

Example 1—Formation of DG-OFET Structure

A molybdenum (Mo) layer was deposited to a thickness of about 40 nm by sputtering and patterned (mask 1) to form a bottom gate electrode. Thereafter, a silicon oxide-based dielectric ($SiO_x$) was deposited to a thickness of about 100 nm using a plasma-enhanced chemical vapor deposition (PE-CVD) process at 350° C. and patterned (mask 2) to form a bottom gate insulator. A stack of layers of Mo (10 nm)/Au (50 nm) was sputtered and patterned (mask 3) to form the source/drain (S/D) electrodes and an octadecyltrimethoxysilane (OTS) self-assembled monolayer (SAM) was then coated on the S/D electrode and $SiO_x$ layer to passivate the surface of $SiO_x$ and enhance film quality of a thiophene-based OSC semiconductor active layer.

The active layer was deposited using solution spin-coating followed by annealing in a nitrogen gas ambient. An interlayer is then deposited over the active layer and may either be PMMA (deposited using solution spin-coating) or parylene (deposited using thermal evaporation). The role of PMMA or parylene is to provide a smooth interface with the active layer and reduce the vertical leakage current. A high-k dielectric polyvinylidene fluoride-hexafluoropropylene (PVDF-HFP) is deposited to a thickness of about 800 nm using solution spin-coating followed by annealing in a nitrogen gas ambient atop the interlayer. The interlayer and high-k dielectric collectively function as a top gate insulator. Specifically, one role of the low-k interlayer is to provide a smooth interface with OSC semiconductor active layer and to reduce vertical leakage current of the OTFT. The maximum annealing temperature for all the organic layers (e.g., active layer, interlayer, high-k dielectric) is about 160° C.

Thereafter, a second stack of layers of Mo (10 nm)/Au (50 nm) was sputtered at room temperature as the top gate electrode. Finally, the active layer, interlayer, high-k dielectric layer, and Mo/Au top gate layer were patterned (mask 4) using a one-time mask alignment and subsequent etching (e.g., wet or dry) steps of the top gate. Then, reactive ion etching (RIE) of the high-k dielectric, interlayer, and OSC active layer is conducted to form the final OTFT structure. In this manner, damage from chemical solvents to the OSC semiconductor material may be mitigated and processing costs from using fewer number of masks may be reduced.

Figure 9:
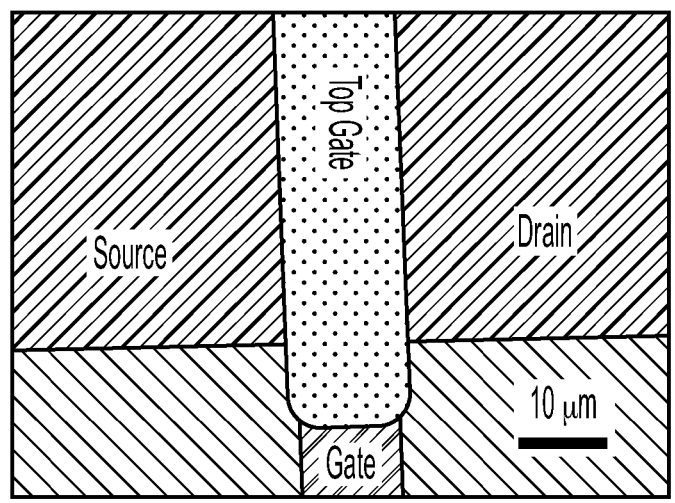
FIG. 9 illustrates a plane-view optical image of a fabricated DG OTFT, according to some embodiments.

FIG. 9 illustrates a plane-view optical image of a fabricated DG OTFT, according to some embodiments. The top gate is roughly equivalent in size as the bottom gate, and both overlap about 2 μm with the S/D electrodes.

Example 2—Performance Measurements

Electrical characteristics of the OTFTs formed by the processes described herein are measured in air under dark atmosphere using an Agilent 4155C semiconductor parameter analyzer. The turn-on voltage ($V_{ON}$) is taken as the $V_{GS}$ at which the $I_{DS}$ starts to monotonically increase. The field-effect mobility ($\mu_{FE}$) is derived from the transconductance $gM=\partial I_{DS}/\partial V_{GS}$, with $V_{DS}=1V$. For DG-driving, the sum of capacitances from the bottom gate insulator and the top gate insulator is used to extract mobility. To evaluate properties of the high-k dielectric (PVDF-HFP), a metal-insulator-metal (MIM) structure was fabricated. The capacitance-voltage (C-V) characteristics of the MIM structure was measured using an Agilent E4980A Precision LCR Meter with a range of 20 Hz to 2 MHz.

Leakage current density and capacity of PVDF-HFP high-k dielectric is measured using metal-insulator-metal (MIM) structures: ITO (bottom gate)/PVDF-HFP (high-k dielectric)/Al (top gate), and ITO (bottom gate)/interlayer/PVDF-HFP (high-k dielectric)/Al (top gate). The vertical leakage current density for the PVDF-HFP single layer is in a range of $10^{-7}$ to $10^{-6}$ A/cm². The relatively large leakage current might be due to the small amount of mobile ions ($10^{-10}$ S/cm) in PVDF-HFP dielectrics. For at least this reason, an ultra-thin low-k polymer may be inserted between the OSC semiconductor active layer and the high-k dielectric layer to block leakage current. Measured current density for the interlayer/PVDF-HFP stacked layers is less than $10^{-8}$ A/cm² within the measurement range. Capacitance for these stacked layers is 20.1 nF/cm² at 20 Hz, which is slightly lower than that of a PVDF-HFP single layer (23.1 nF/cm²). This lowered leakage current and high capacitance are beneficial for high performance OTFTs.

Figure 6A:
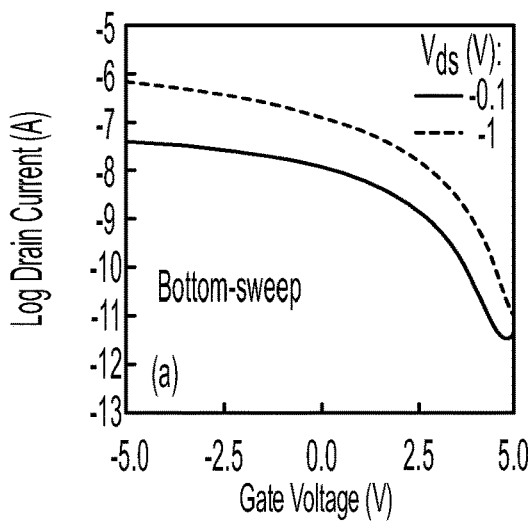
FIGS. 6A to 6F illustrate transfer and output characteristics of a DG OTFT fabricated using processes described herein under various sweep modes, according to some embodiments.
Figure 6B:
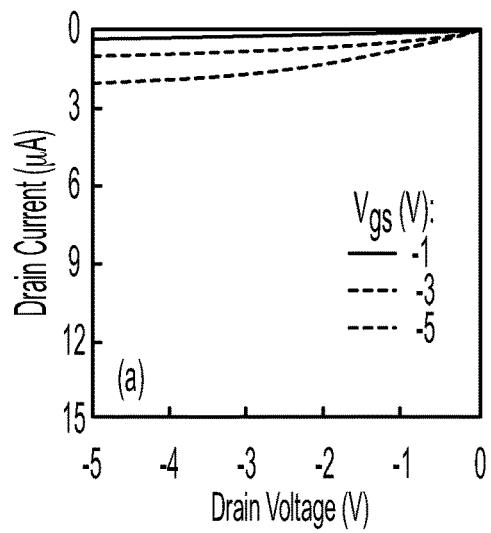
Figure 6C:
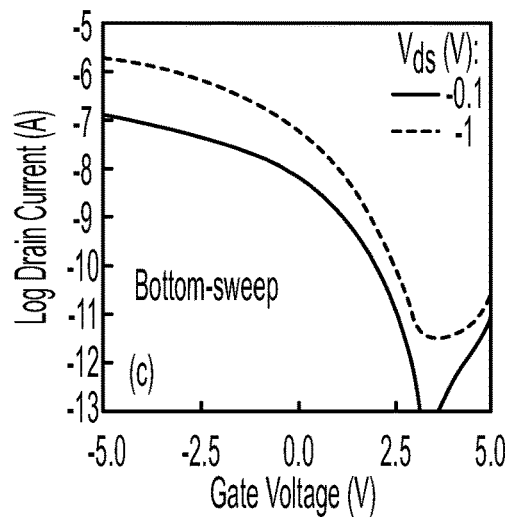
Figure 6D:
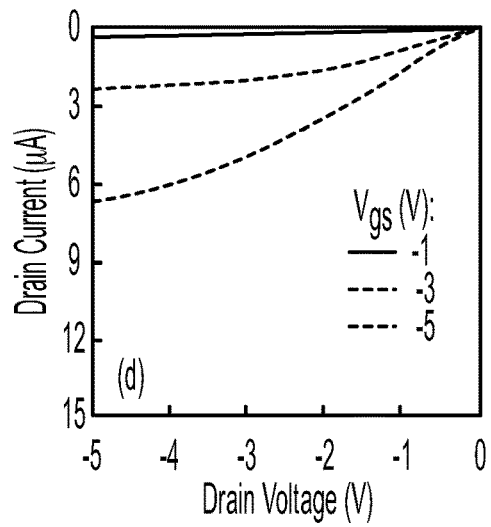
Figure 6E:
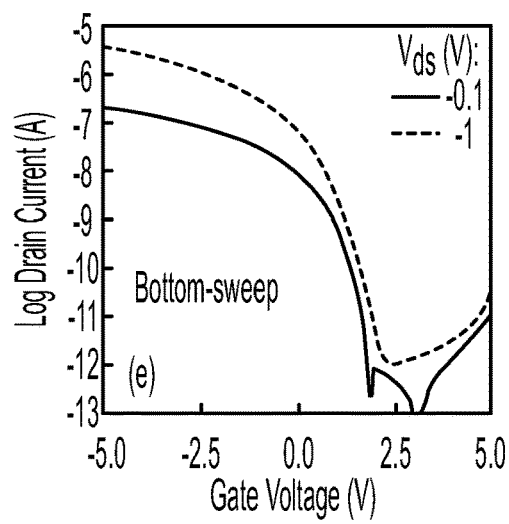
Figure 6F:
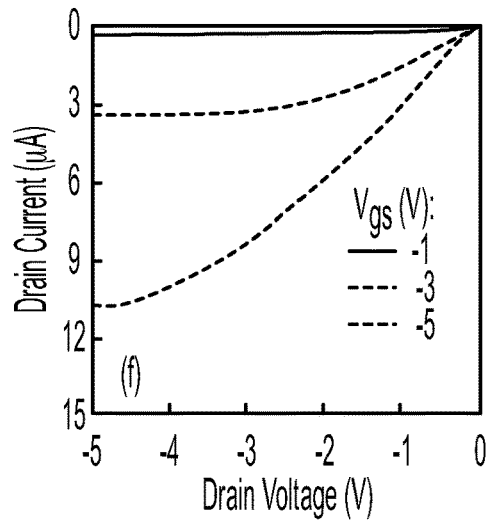

FIGS. 6A to 6F illustrate transfer (FIGS. 6A, 6C, 6E) and output (FIGS. 6B, 6D, 6F) curves of DG OTFTs fabricated using processes described herein under various sweep modes with low voltage operation (less than 5V). Specifically, FIGS. 6A and 6B describe performance under "bottom gate" (BG) mode (i.e., gate voltage applied to bottom gate, while grounding top gate (i.e., "floating")); FIGS. 6C and 6D describe performance under "top gate" (TG) mode (i.e., gate bias applied to top gate, while grounding bottom gate);

and FIGS. 6E and 6F describe performance under "dual gate" (DG) mode (i.e., top gate is electrically tied to bottom gate).

For each of the measurements in FIGS. 6A to 6F, the thickness of the OSC semiconductor active layer is about 50 nm. The channel width (W) and length (L) are 1000 μm and 10 μm, respectively. All TFTs of FIGS. 6A to 6F operate in p-channel depletion mode with a clear modulation of channel conductivity within a small voltage range of less than 5V.

No signs of current crowding were observed, indicating good Ohmic contacts between the OSC semiconductor layer and S/D electrodes. The BG mode TFT exhibits a $F_E$ of 0.05 cm$^2$/Vs and large lower sub-threshold slope (SS) of 0.51 V/dec. The mobility is much lower than previously reported OTFTs using $SiO_x$ gate dielectrics because the supplied voltage here is much lower ($V_{GS}$=−5V). Owing to the interlayer (e.g., PMMA or parylene)/high-k dielectric (e.g., PVDF-HFP) stacked top gate insulator, the operation of the TG TFT is superior to that of BG TFTs: $I_{ON}$ is about three times higher, and the FE is about 0.36 cm$^2$/Vs. In the DG-driving mode, the achieved $\mu_{FE}$ of 0.30 cm$^2$/V s, $V_{ON}$ of 2.5V, and smaller SS of 0.27 V/dec. is about half that in the BG mode or the TG mode. For example, the DG mode $I_{ON}$ is approximately equal to the sum of that in the BG and TG modes. More extracted TFT parameters are summarized in Table 2.

TABLE 2

| Item | Device Organic TFTs | | |
|---|---|---|---|
| | Bottom gate | Top gate | Dual gate |
| $\mu_{FE}$ (cm$^2$/Vs) | 0.05 | 0.36 | 0.30 |
| $V_{on}$ (V) | 4.8 | 3.4 | 2.4 |
| SS (V/dec) | 0.51 | 0.45 | 0.27 |
| $I_{on/off}$ | 10$^4$ | 10$^6$ | 10$^7$ |
| $I_{DS}$ at $V_{DS}$ = $V_{GS}$ = −5 V (μA) | 2.4 | 6.9 | 11 |

In DG-driving OTFT, the top gate and bottom gate are electrically connected and simultaneous controlled, similar to conventional TFTs. When $V_{TG}$=$V_{BG}$ is negative, accumulation of holes form at the back and front interfaces of the OSC semiconductor layer, leading to the formation of two channels (i.e., one channel modulated by the bottom gate and one channel modulated by the top gate) since the thickness of the OSC semiconductor layer is approximately 50 nm and much larger than a thickness of the accumulation layer (5 nm) of free hole carriers. The two channels are separate, and both contribute to the higher $I_{ON}$ seen in the DG mode. This is different from DG oxide TFTs with thin active layers, where the top and bottom channels overlap each other (bulk accumulation) leading to three-to-seven times higher current. Carrier concentration in the channel layer may be controlled more efficiently by DG-driving. The SS improves due to this high gate drive, leading to fast filling-up of states as the TFT switches from off-state to on-state. Here, the mobility of DG mode is slightly less than that of the TG mode due lack of perfectly symmetry.

The interlayer (e.g., PMMA or parylene)/high-k dielectric (e.g., PVDF-HFP) stacked top gate insulator provides better interface quality (i.e., smaller SS) compared to an OSC semiconductor/$SiO_x$ bottom interface. Importantly, mobility values are comparable to that of a-Si:H TFTs, however, DG OTFTs achieve this using a much lower operation voltage (5V).

Figure 7A:
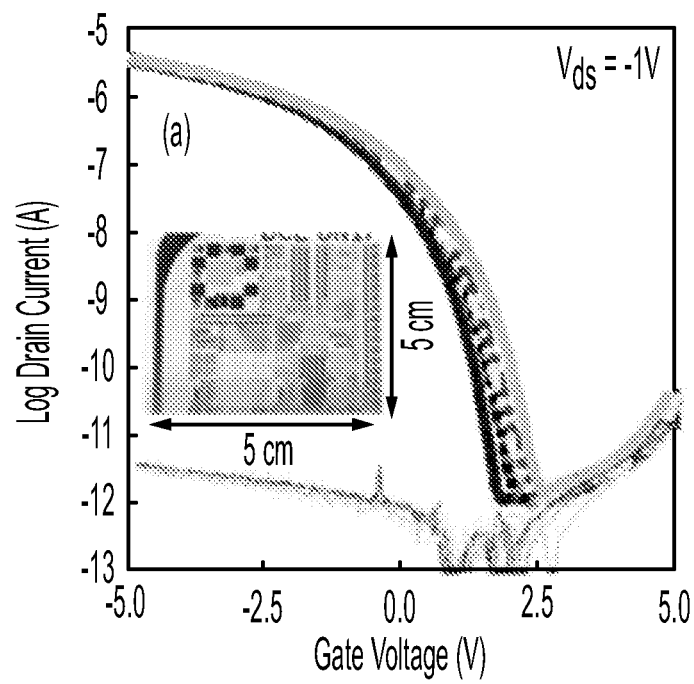
FIGS. 7A and 7B illustrate the performance of dual-gate (DG)-driving OTFTs, according to some embodiments.
Figure 7B:
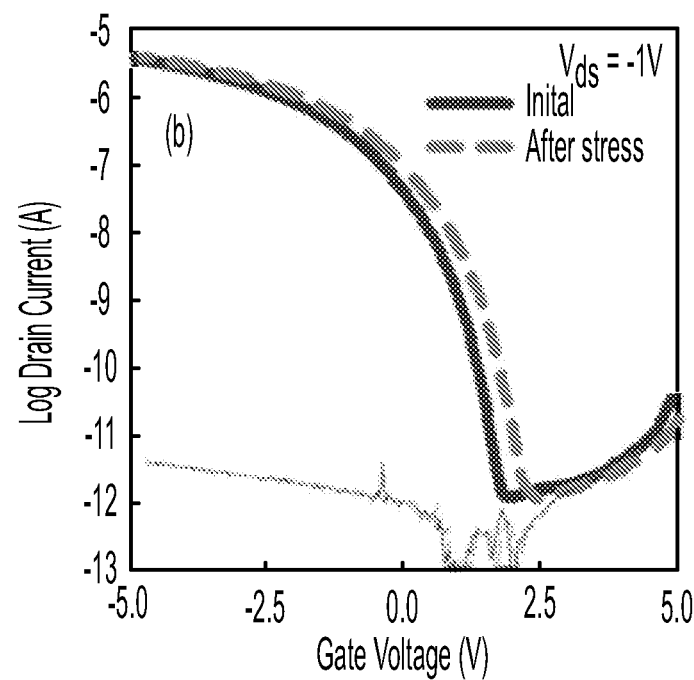

Turning now to FIGS. 7A and 7B, these figures illustrate the performance of dual-gate (DG)-driving OTFTs. Specifically, FIG. 7A demonstrates the transfer curves of eight DG OTFTs superimposed atop each other to test for uniformity over an area of 5 cm×5 cm. The variation in $V_{ON}$ ($\Delta V_{ON}$) is <1 V for the eight DG OTFTs, which were all located within a 5 cm× by 5 cm glass. FIG. 7B shows the evolution (i.e., shift) of transfer curves before and after constant current stress (CCS). The CCS was conducted by applying $V_{GS}$ and $V_{DS}$ to induce a constant current of 1 μA in the conducting channel, which is a typical current value to drive an AMO-LED pixel. The $\Delta V_{ON}$ is about 0.8V after stress for 1 hour in dark in air. Excellent stability is observed and is mainly due to very low density of states (DOS) of the OSC semiconductor material of the active layer, good channel/gate insulator interfaces at both the top gate (OSC semiconductor layer/interlayer (e.g., PMMA or parylene)/high-k dielectric (e.g., PVDF-HFP) and the bottom gate (first dielectric ($SiO_x$)/polymeric SAM (e.g., OTS)/OSC semiconductor layer), and self-passivation of the DG structure by isolating in ambient air.

Example 3—Dielectric Properties of PVDF-HFP-Based Top Gate Insulator

Figure 8A:
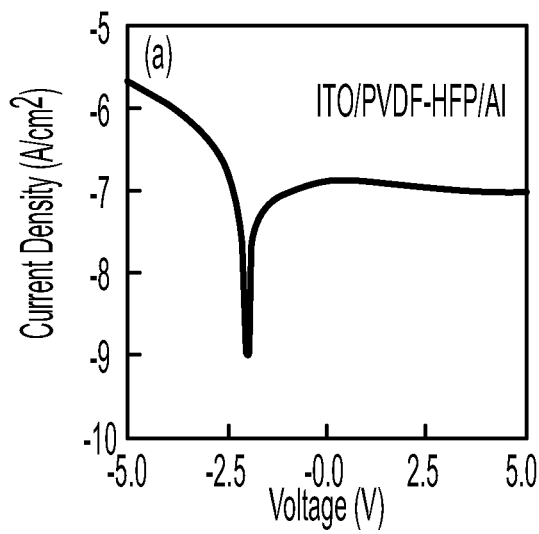
FIGS. 8A to 8D illustrate dielectric properties of PVDF-HFP-based top gate insulators, according to some embodiments.
Figure 8B:
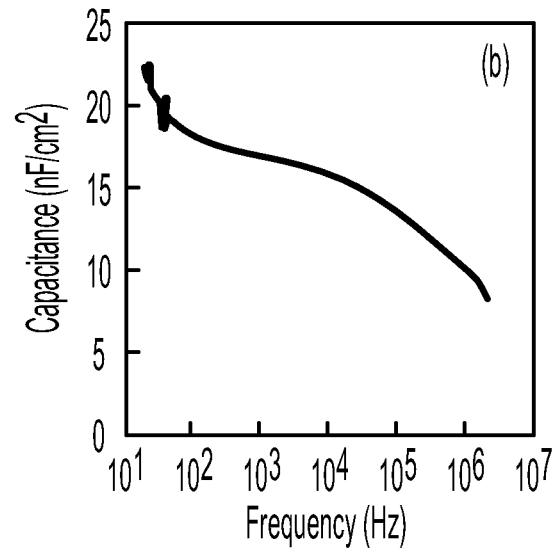
Figure 8C:
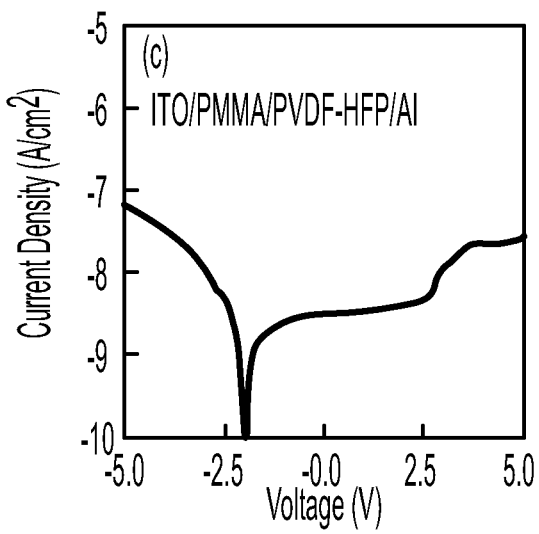
Figure 8D:
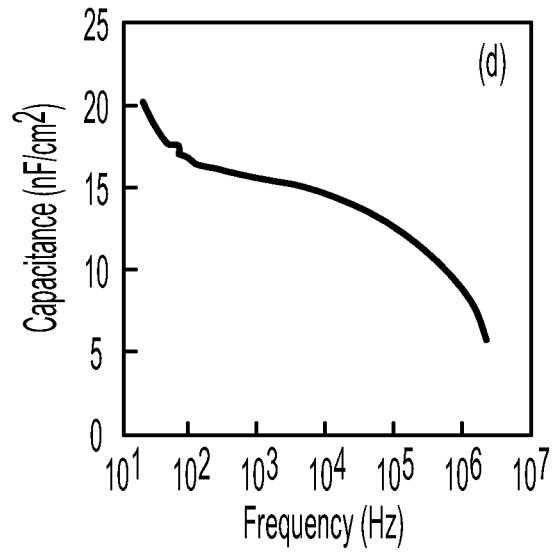

FIGS. 8A to 8D illustrate dielectric properties of PVDF-HFP-based top gate insulators, according to some embodiments. Specifically, FIG. 8A shows leakage current density and FIG. 8B shows specific capacitance as a function of frequency (20 Hz to 2 MHz) of an ITO/PVDF-HFP/Al test structure (i.e., without the interlayer). FIG. 8C shows leakage current density and FIG. 8D shows frequency dependent capacitance for a ITO/PMMA (interlayer)/PVDF-HFP/Al sandwich structure.

FIGS. 8A and 8B demonstrate, respectively, the measured leakage current density and capacitance as a function of frequency for an ITO/PVDF-HFP/Al sandwich structure. The vertical leakage current density is about 10$^{-6}$ to 10$^{-7}$ A/cm$^2$ for PVDF-HFP single layer. The capacitance is 23.1 nF/cm$^2$ at 20 Hz and 8.3 nF/cm$^2$ at 2 MHz. The relatively large leakage current and frequency-dependent capacitance is due to mobile ions and their low mobility in the PVDF-HFP dielectric. FIGS. 8C and 8D demonstrate, respectively, the measured leakage current density and capacitance as a function of frequency for an ITO/PMMA/PVDF-HFP/Al sandwich structure. Owing to the thin PMMA interlayer, the leakage current density is well below 10$^{-7}$ A/cm$^2$ within the entirety of the measurement range. The capacitance experiences a slight drop to 20.1 nF/cm$^2$ at 20 Hz. The low leakage current and high capacitance is essential for high performance TFTs.

Example 4—Device Incorporation

Figure 10A:
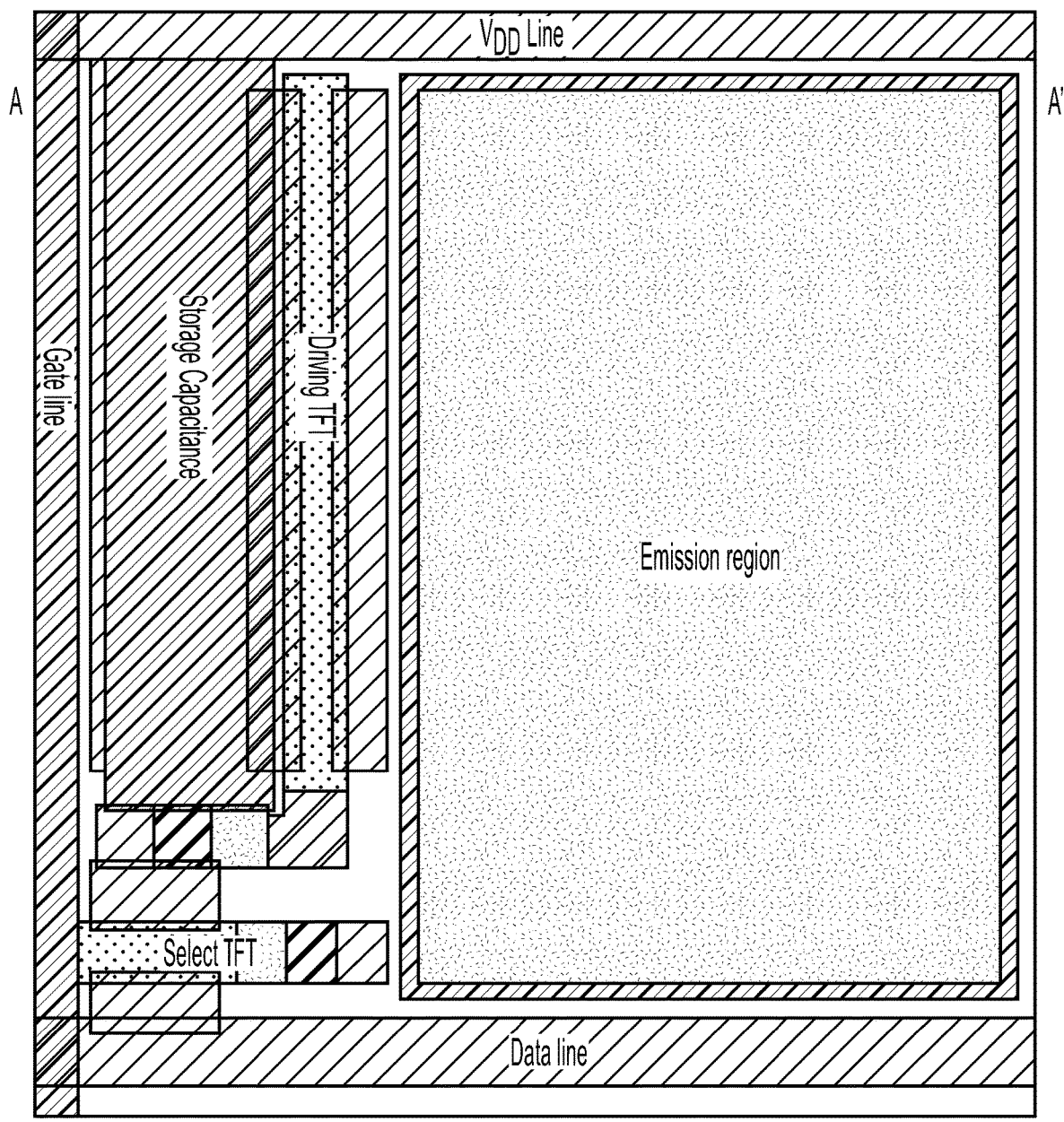
FIGS. 10A and 10B illustrate AMOLED integration based-on low-voltage operation DG-driving OTFTs as described herein.
Figure 10B:
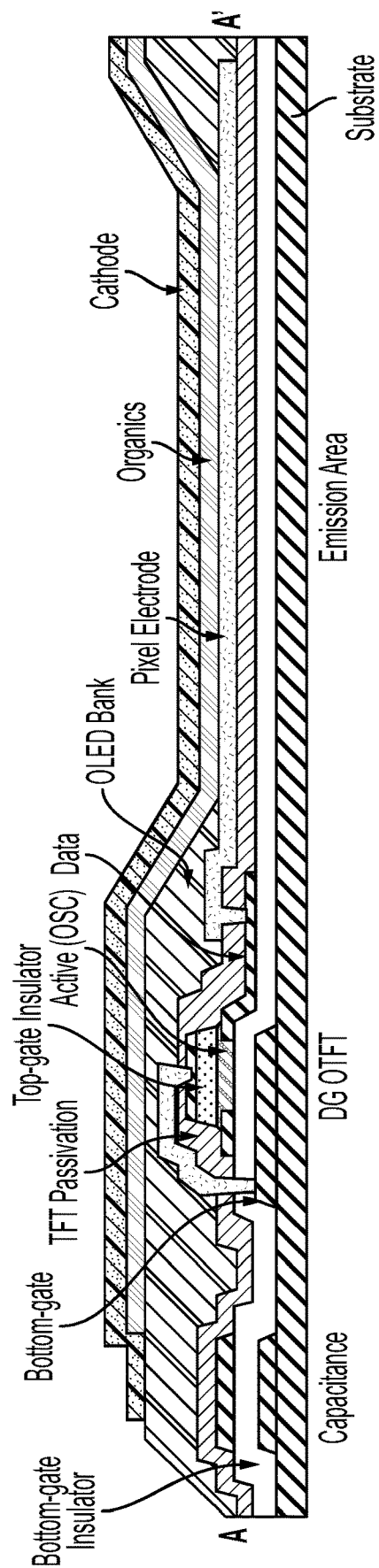

FIGS. 10A and 10B illustrate AMOLED integration based-on low-voltage operation DG-driving OTFTs as described herein. Specifically, FIG. 10A shows a layout design of an active pixel covering an area of 160 μm×160 μm while FIG. 10B shows a schematic cross-section along line A-A' as in FIG. 10A. The DG-driving OTFT as described herein and formed by the processes described herein have enhanced $I_{ON}$, small SS, large $I_{ON}/I_{OFF}$ ratio, and excellent stability, thereby making them applicable as voltage-controlled resistors or current drivers for display panels.

Each pixel is designed with 2T-1C architecture covering an area of 160 μm×160 μm (158 ppi). To achieve DG-driving, the bottom gate and top gate are tied together through via holes and pixel metal layer (see FIG. 10B). All layers in the DG OTFT backplane may be patterned by standard photolithographic methods. As disclosed herein, the total number of masks needed for DG OTFT are less than those needed for conventional structures formed by standard photolithographic methods. The maximum temperature in the complete process may be controlled below 160° C., which is compatible with most flexible substrates (e.g., polyimide). The low-cost and flexible displays with small power consumption are promising for future portable electronics.

Thus, as presented herein, a low-voltage operation dual-gate (DG) organic TFT fabricated using a simple four mask process is described. Combined with a high-k dielectric, the DG OTFT shows enhanced current driving capability, excellent uniformity and stability, and compatibility with conventional photolithographic patterning methods, making it a promising candidate for low power, ultra-flexible displays. Moreover, using organic polar dielectrics that exhibit high capacitance (partially due to double layer capacitance effects) achieves high current output from the TFT, which allows driving OLED devices. One technical problem overcome here is the ability to deposit and anneal PVDF-HFP directly on top of an OSC semiconductor without severely degrading performance of the TFT device.

The DG-driving OTFTs demonstrate good performance, having a $\mu_{FE}$ of about 0.3 cm$^2$/V·s, SS of 0.27 V/dec and $V_{ON}$ of 2.5V under a low operation voltage of 5V. The current driving capability is enhanced by approximately four times than that of a bottom gate device. The stability and uniformity is enhanced due to optimized fabrication processes and self-passivation effect of DG TFT structure. One application for the DG TFT structure may be for flexible AMOLED, though others include flexible LCDs, and areal sensors.

Advantages of the device and/or process described herein include: (1) a low operating voltage (less than 5V); (2) minimal masking steps during fabrication; (3) an enhanced current drive more than four times greater than that for conventional designs; (4) improved device stability; and (5) capability of driving OLED devices.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As utilized herein, "optional," "optionally," or the like are intended to mean that the subsequently described event or circumstance can or cannot occur, and that the description includes instances where the event or circumstance occurs and instances where it does not occur. The indefinite article "a" or "an" and its corresponding definite article "the" as used herein means at least one, or one or more, unless specified otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A thin-film transistor (TFT), comprising:
a substrate;
an organic semiconductor (OSC) layer positioned on the substrate;
a dielectric layer positioned on the OSC layer; and
a polymeric interlayer disposed in-between the OSC layer and the dielectric layer,
wherein the dielectric layer is configured to exhibit a double layer capacitance effect,
wherein the OSC layer is a polymer blend comprising at least one organic semiconductor (OSC) polymer,
wherein the at least one OSC polymer is a diketopyrrolopyrrole-fused thiophene polymeric material, and
wherein the fused thiophene is beta-substituted.

2. The TFT of claim 1, wherein the at least one OSC polymer comprises a first portion and a second portion, wherein at least one of the first portion or the second portion comprises at least one UV-curable side chain.

3. The TFT of claim 2, wherein the at least one UV-curable side chain comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

4. The TFT of claim 2, wherein only the first portion comprises at least one UV-curable side chain.

5. The TFT of claim 2, wherein both the first portion and the second portion comprise the at least one UV-curable side chain.

6. The TFT of claim 1, wherein the polymer blend further comprises: at least one crosslinker,
wherein the at least one crosslinker comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

7. The TFT of claim 1, wherein the polymer blend further comprises: at least one photoinitiator, wherein the at least one photoinitiator is present in a range of 0.1 wt. % to 10 wt. %.

8. The TFT of claim 1, wherein the polymer blend further comprises: at least one of antioxidants, lubricants, compatibilizers, leveling agents, or nucleating agents present in a range of 0.05 wt. % to 5 wt. %.

9. The TFT of claim 1, wherein the at least one OSC polymer comprises the repeat unit of Formula 1 or Formula 2, or a salt, isomer, or analog thereof:

Formula 1

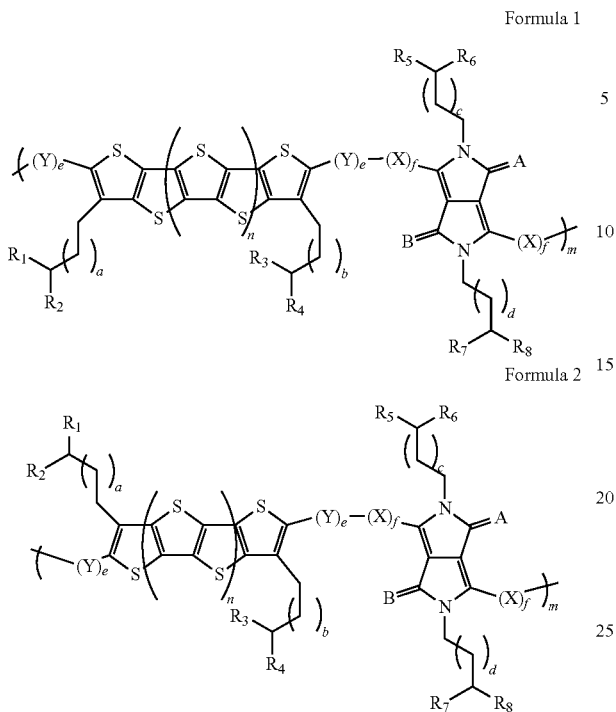

Formula 2 wherein in Formula 1 and Formula 2:
m is an integer greater than or equal to one;
n is 0, 1, or 2;
$R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or Cs or greater cycloalkyl;
a, b, c, and d are independently, integers greater than or equal to 3;
e and f are integers greater than or equal to zero;
X and Y are, independently a covalent bond, an optionally substituted aryl group, an optionally substituted heteroaryl, an optionally substituted fused aryl or fused heteroaryl group, an alkyne or an alkene; and
A and B may be, independently, either S or O, with the provisos that:
i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;
ii. if any of $R_1$, $R_2$, $R_3$, or $R_4$ is hydrogen, then none of $R_5$, $R_6$, $R_7$, or $R_8$ are hydrogen;
iii. if any of $R_5$, $R_6$, $R_7$, or $R_8$ is hydrogen, then none of $R_1$, $R_2$, $R_3$, or $R_4$ are hydrogen;
iv. e and f cannot both be 0;
v. if either e or f is 0, then c and d, independently, are integers greater than or equal to 5; and
vi. the polymer having a molecular weight, wherein the molecular weight of the polymer is greater than 10,000.

10. The TFT of claim 1, wherein the polymer blend further comprises: at least one photoinitiator,
wherein the at least one photoinitiator comprises: 1-hydroxy-cyclohexyl-phenyl-ketone (184); 2-benzyl-2-dimethylamino-1-(4-morpholinophenyl)-butanone-1 (369); diphenyl (2,4,6-trimethylbenzoyl) phosphine oxide (TPO); 2-isopropyl thioxanthone (ITX); 1-[4-(phenylthio) phenyl]-1,2-octanedione 2-(O-benzoyloxime) (HRCURE-OXE01); 2,2-dimethoxy-1,2-diphenylethan-1-one (BDK); benzoyl peroxide (BPO); hydroxyacetophenone (HAP); 2-hydroxy-2-methylpropphenone (1173); 2-methyl-4'-(methylthio)-2-morpholinopropiophenone (907); 2-benzyl-2-(dimethylamino)-4'-morpholinobutyrophenone (IHT-PI 910); Ethyl-4-(dimethylamino) benzoate (EDB); methyl o-benzoyl benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thiozanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4 (methylthiol) phenyl]-2-morpholino propanone (1) (MMMP); 4-phenylbenzophenone (PBZ); 2,4,6-trimethyl-benzoylethoxyl phenyl phosphine oxide (TEPO); bis(4-tert-butylphenyl) iodonium perfluoro-1-butanesulfonate; bis(4-tert-butylphenyl) iodonium p-toluenesulfonate; bis(4-tert-butylphenyl) iodonium triflate; boc-methoxyphenyldiphenylsulfonium triflate; (4-tert-Butylphenyl) diphenylsulfonium triflate; diphenyliodonium hexafluorophosphate; diphenyliodonium nitrate; diphenyliodonium p-toluenesulfonate; diphenyliodonium triflate; (4-fluorophenyl) diphenylsulfonium triflate; N-hydroxynaphthalimide triflate; N-hydroxy-5-norbornene-2,3-dicarboximide perfluoro-1-butanesulfonate; (4-iodophenyl) diphenylsulfonium triflate; (4-methoxyphenyl) diphenylsulfonium triflate; 2-(4-Methoxystyryl)-4,6-bis (trichloromethyl)-1,3,5-triazine; (4-methylthiophenyl) methyl phenyl sulfonium triflate; 1-naphthyl diphenylsulfonium triflate; (4-phenoxyphenyl) diphenylsulfonium triflate; (4-phenylthiophenyl) diphenylsulfonium triflate; triarylsulfonium hexafluoroantimonate salts, mixed 50 wt. % in propylene carbonate; triarylsulfonium hexafluorophosphate salts, mixed 50 wt. % in propylene carbonate; triphenylsulfonium perfluoro-1-butanesufonate; triphenylsulfonium triflate; tris (4-tert-butylphenyl) sulfonium perfluoro-1-butanesulfonate; tris (4-tert-butylphenyl) sulfonium triflate; aryl diazo salts; diaryliodonium salts; triaryl sulfonium salts; aryl ferrocenium salts; or combinations thereof.

11. The TFT of claim 1, wherein the polymeric interlayer comprises at least one of: polymethyl methacrylate (PMMA), parylene, polystyrene, polyimide, poly (3-dodecylthiophene-2,5-diyl) (P3DDT), polyvinyl phenol, polyvinyl alcohol, poly (4-vinyl phenol) (P4VP), polyacrylic acid, or combinations or copolymers thereof.

12. The TFT of claim 1, wherein the polymeric interlayer has a thickness in a range of 1 nm to 100 nm.

13. The TFT of claim 1, wherein the dielectric layer is a high-k dielectric layer comprising at least one of polyvinylidene fluoride-hexafluoropropylene (PVDF-HFP), alkali ion-containing polyacrylic acid, or combinations thereof.

14. The TFT of claim 1, wherein the dielectric layer has a thickness in a range of 1 nm to 1000 nm.

15. The TFT of claim 1, further comprising:
a bottom gate disposed on the substrate;
a second dielectric disposed at least in-between the bottom gate and the OSC layer;
source and drain electrodes positioned atop the second dielectric and in direct contact with the OSC layer; and
a top gate in direct contact with the dielectric layer.

16. The TFT of claim 15, further comprising:
a polymeric self-assembled monolayer (SAM) disposed over the second dielectric layer and source and drain electrodes.

17. The TFT of claim 16, wherein the SAM comprises at least one of octadecyltrimethoxysilane (OTS), hexamethyldisilazane (HMDS), octadecylphosphonic acid (ODPA), or combinations thereof.

18. A method of forming the TFT of claim 15, the method comprising:
providing the substrate;
providing the bottom gate atop the substrate;
disposing consecutively from the substrate, the OSC layer, the polymeric interlayer, the dielectric layer, and a top gate layer; and
patterning the OSC layer, the polymeric interlayer, the dielectric layer, and the top gate layer using a single mask, thereby forming the TFT comprising the top gate,
wherein the method comprises at most four patterning steps.

19. The TFT of claim 1, configured to achieve at least one of:
a field-effect mobility ($\mu_{FE}$) of at least 0.3 cm$^2$/V·s;
a sub-threshold slope of at most 0.27 V/dec; and
a turn-on voltage ($V_{ON}$) of at most 2.5V under an operation voltage of 5V.

\* \* \* \* \*